(12) United States Patent
Otterstedt et al.

(10) Patent No.: US 8,533,557 B2
(45) Date of Patent: Sep. 10, 2013

(54) DEVICE AND METHOD FOR ERROR CORRECTION AND PROTECTION AGAINST DATA CORRUPTION

(75) Inventors: Jan Otterstedt, München (DE); Rainer Goettfert, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 254 days.

(21) Appl. No.: 13/016,308

(22) Filed: Jan. 28, 2011

(65) Prior Publication Data

US 2012/0198302 A1     Aug. 2, 2012

(51) Int. Cl.
    *H03M 13/00* (2006.01)
(52) U.S. Cl.
    USPC .................... 714/755; 714/759; 714/774
(58) Field of Classification Search
    USPC .................... 714/755, 759, 763, 769, 774
    See application file for complete search history.

(56) References Cited

U.S. PATENT DOCUMENTS

| | | | |
|---|---|---|---|
| 4,139,148 A | 2/1979 | Scheuneman et al. | |
| 4,163,147 A | 7/1979 | Scheuneman et al. | |
| 4,899,340 A * | 2/1990 | Lubarsky | 714/759 |
| 5,243,650 A * | 9/1993 | Roth et al. | 380/237 |
| 5,307,409 A | 4/1994 | Driscoll | |
| 5,533,035 A | 7/1996 | Saxena et al. | |
| 5,563,894 A | 10/1996 | Fujiwara et al. | |
| 5,673,316 A | 9/1997 | Auerbach et al. | |
| 7,979,826 B1 * | 7/2011 | Trimberger | 716/117 |
| 8,054,740 B2 * | 11/2011 | Costa et al. | 370/208 |
| 8,199,914 B2 * | 6/2012 | Sonnekalb | 380/263 |
| 2001/0056564 A1 | 12/2001 | Cypher | |
| 2006/0136800 A1 | 6/2006 | Kawabata et al. | |
| 2006/0179395 A1 | 8/2006 | Sonnekalb | |
| 2007/0174753 A1 | 7/2007 | Sonnekalb | |

FOREIGN PATENT DOCUMENTS

| | | |
|---|---|---|
| DE | 10 2005 001 953 A1 | 7/2006 |
| DE | 10 2006 003 146 A1 | 8/2007 |

* cited by examiner

*Primary Examiner* — Fritz Alphonse
(74) *Attorney, Agent, or Firm* — Murphy, Bilak & Homiller, PLLC

(57) ABSTRACT

A device for protecting a data word against data corruption includes first and second determiners. The first determiner is configured to determine an error correction code $cv_A$ associated with a data word a so that $cv_A = aA^T$, with A being a generator matrix of a linear systematic base correction code, the columns of which enable performance of an x-bit error correction on replica of the data word a and the associated error correction code $cv_A$. The second determiner is configured to determine an extended error correction code $cv_E$ so that $(cv_A | cv_E) = aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y>x, on a replica of the data word a and the associated error correction code $cv_A$.

25 Claims, 13 Drawing Sheets $$A = \begin{pmatrix} 0000000000000000011111111111 \\ 00000000011111111100000000011111 \\ 000011110000111100000011100001 \\ 011100111000110001000111000100010 \\ 101101001011010010011001000000100 \\ 110111010101000100101010010010001000 \\ 111010100110101000110100100100000 \end{pmatrix} \text{ and}$$

$$H = \begin{pmatrix} 0000000000000000011111111111 & 1000000 \\ 00000000011111111100000000011111 & 0100000 \\ 000011110000111100000011100001 & 0010000 \\ 011100111000110001000111000100010 & 0001000 \\ 101101001011010010011001000000100 & 0000100 \\ 110111010101000100101010010010001000 & 0000010 \\ 111010100110101000110100100100000 & 0000001 \end{pmatrix}$$

$$F = \begin{pmatrix} 0000000000000000011111111111 \\ 00000000011111111100000000011111 \\ 000011110000111100000011100001 \\ 011100111000110001000111000100010 \\ 101101001011010010011001000000100 \\ 110111010101000100101010010010001000 \\ 111010100110101000110100100100000 \\ \\ 101110110001000010000100011111100 \\ 1001010111111110111101011001111 \\ 0110010101110110111100000100000000 \\ 101010010010100100010001111100011 \\ 001000001110000101000110011111010 \end{pmatrix}$$

| FIG 4A | FIG 4 |
|---|---|
| FIG 4B | |

FIG 4A $$R = \begin{pmatrix} 00000000000000000111111111111 & 1000000 & 00000 \\ 000000000111111110000000011111 & 0100000 & 00000 \\ 000011110000111100000011100001 & 0010000 & 00000 \\ 011100111000110001000111001000010 & 0001000 & 00000 \\ 101101001011010010011001000000100 & 0000100 & 00000 \\ 110111010101000100101010011001000 & 0000010 & 00000 \\ 111010100110101000110100100100000 & 0000001 & 00000 \\ \\ 101110110001000010000100011111100 & 0000000 & 10000 \\ 100101011111111011110101100111 & 0000000 & 01000 \\ 011001010111011011100000100000000 & 0000000 & 00100 \\ 101010010010100100010001111100011 & 0000000 & 00010 \\ 001000001110000101000110011111010 & 0000000 & 00001 \end{pmatrix}$$

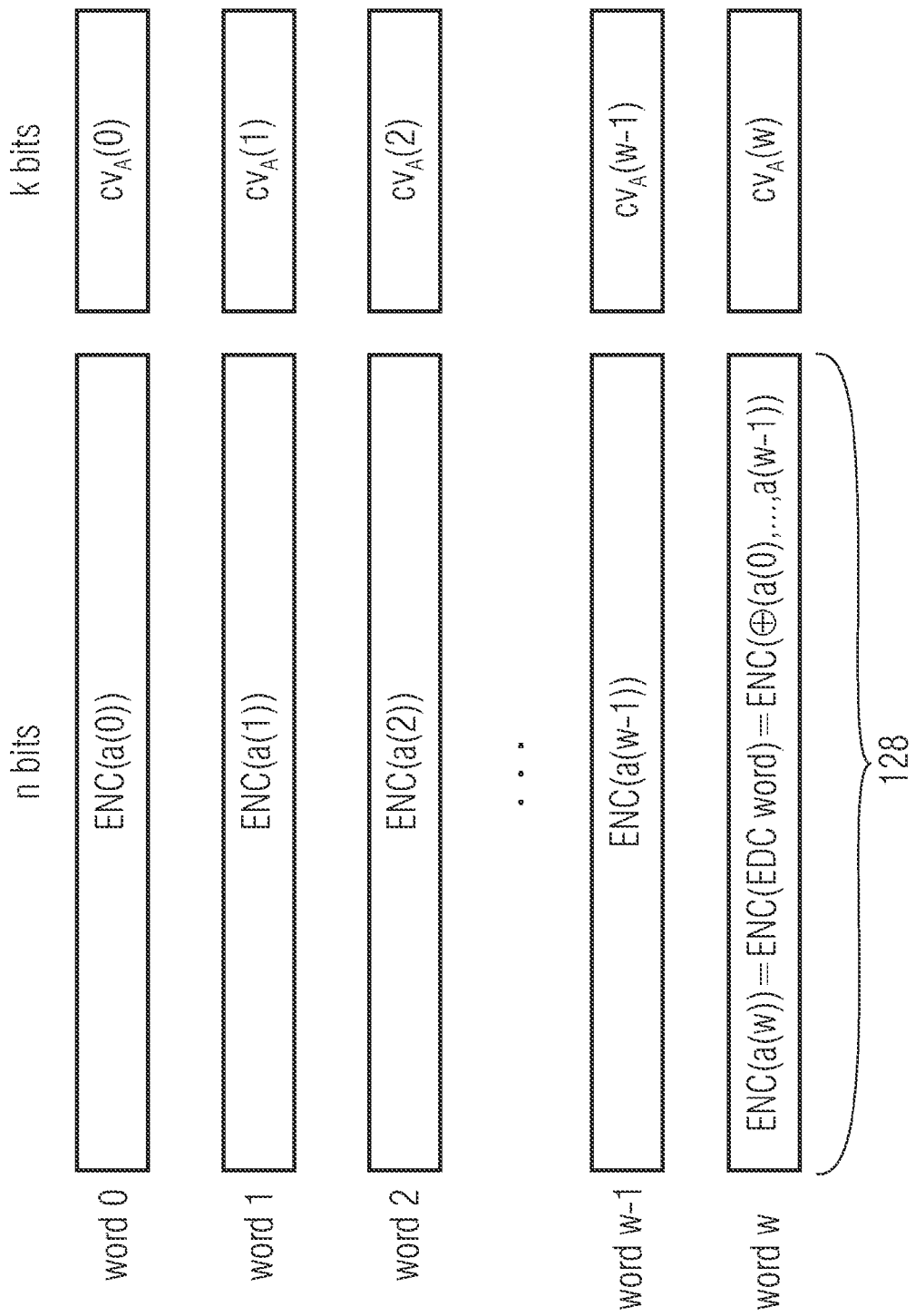

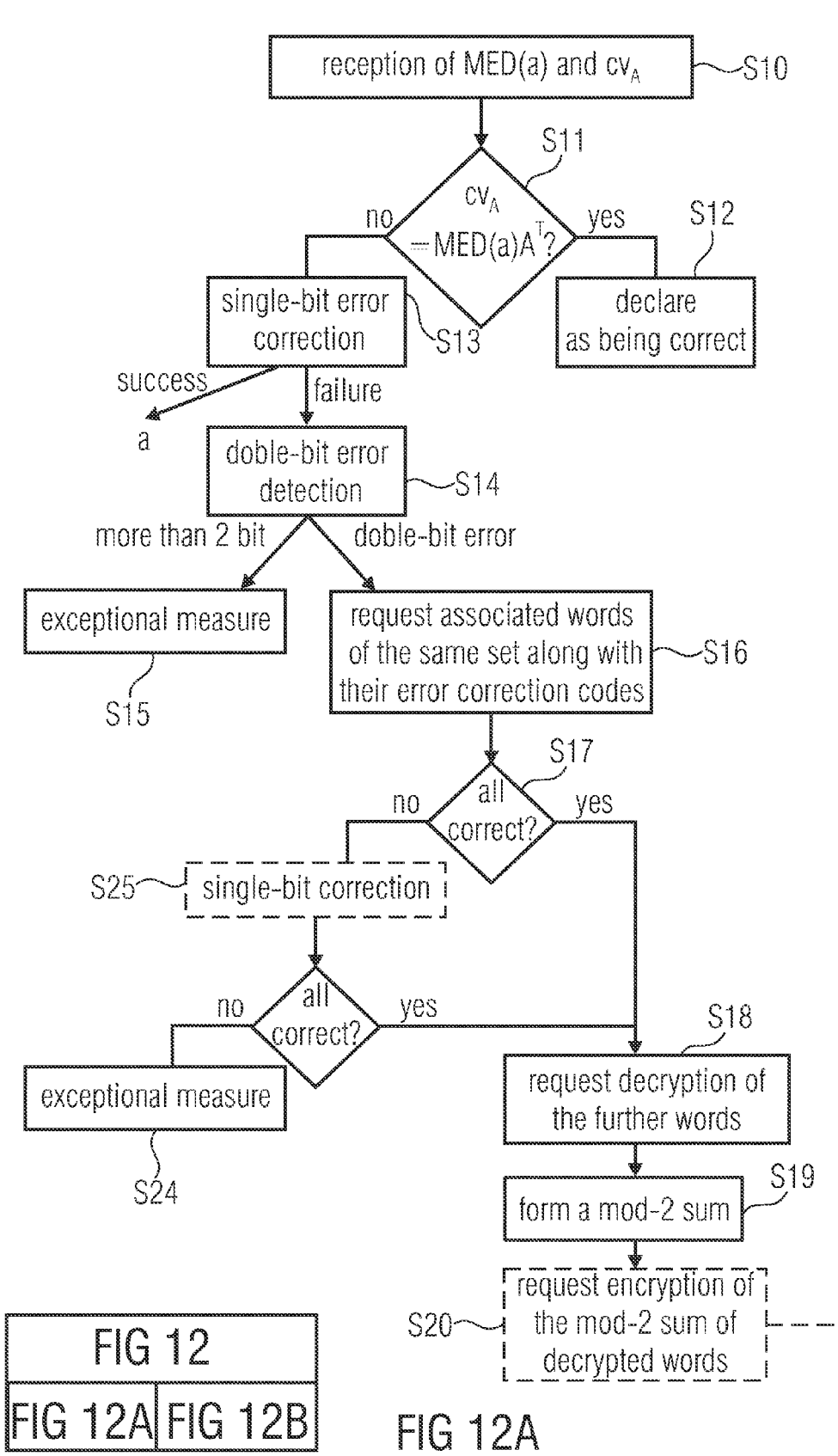

DEVICE AND METHOD FOR ERROR CORRECTION AND PROTECTION AGAINST DATA CORRUPTION

TECHNICAL FIELD

Embodiments described herein relate to error correction and protection against data corruption.

BACKGROUND

Error correction is one measure for obtaining correct data from a source such as memory or a transmitter. Error correction may reduce the costs involved with implementing the data source as a higher data rate is acceptable due to the data correction capability. Such error correction is used, for example, for memory data stored in a RAM (random access memory), ROM (read only memory), cache memory, EEPROM (electrically erasable programmable read-only memory), and even hard drives, CDs (compact discs), DVDs (digital versatile discs), magnetic tapes and the like. In forward error correction, the data to be protected against data corruption is, in units of data words, for example, mapped onto codewords. In accordance with systematic codes, codewords include the data word to be protected plus some error correction code. Many such systematic codes are available, such as Reed Solomon codes, for example.

However, an error correction capability not only increases the demands imposed on the data source, but also increases the amount of data due to the addition of redundancy and the data latency due to the granularity at which the data is protected.

SUMMARY

According to an embodiment of a device for error correction, the device includes a receiver and a checker. The receiver is configured to receive a data word a and an error correction code $cv_A$ associated with the data word a. The checker is configured to declare the data word a as being correct if $cv_A$ equals $aA^T$, with A being a generator matrix of a linear systematic base correction code. The checker is further configured to perform, if $cv_A$ is unequal to $aA^T$, are x-bit error correction on the data word a and the associated error correction code $cv_A$ using columns of A in order to obtain a corrected version of the data word a and the associated error correction code $cv_A$ in the case of the x-bit error correction being successful, and assume a number of corrupted bits of the data word a and the associated error correction code $cv_A$ to be greater than x. The checker is also configured to perform, if the x-bit error correction fails, obtaining an extension error correction code $cv_E$ and performing a y-bit error correction with y>x, on the data word a and the error correction code $cv_A$ using the extension error correction code $cv_E$ and columns of an extended matrix $$F = \begin{pmatrix} A \\ E \end{pmatrix}$$

of an extended linear systematic correction code according to which $(cv_A|cv_E)=aF^T$ if the data word a, the error correction code $cv_A$ and the extension error correction code $cv_E$ were correct.

According to an embodiment of a device for protecting a data word against data corruption, the device includes first and second determiners. The first determiner is configured to determine an error correction code $cv_A$ associated with a data word a so that $cv_A=aA^T$, with A being a generator matrix of a linear systematic base correction code, the columns of which enable performance of an x-bit error correction on replica of the data word a and the associated error correction code $cv_A$. The second determiner is configured to determine an extended error correction code $cv_E$ so that $(cv_A|cv_E)=aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y>x, on a replica of the data word a and the associated error correction code $cv_A$.

According to an embodiment of a device for error correction, the device includes a receiver and a checker. The receiver is configured to receive an encrypted data word a and an error correction code $cv_A$ associated with the encrypted data word a. The checker is configured to declare the encrypted data word a as being correct if $cv_A=aA^T$, with A being a generator matrix of a linear systematic base correction code and perform, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code $cv_A$ so as to regard an error of the encrypted data word a to be a double-bit error or a more-than-two-bit error. If the error of the encoded data word a is regarded as a double-bit error, the checker is further configured to request a number of further encrypted data words forming, along with the encrypted data word a, a set of w+1 encrypted data words, along with further error correction codes associated with the further encrypted data words, respectively, check all of the further encrypted data words and the further error correction codes as to whether the same are correct, request a decryption of a correct version of the further encrypted data words in order to obtain a decrypted correct version of the further encrypted data words, and form a mod-2 sum of the decrypted correct version of the further encrypted data words to obtain a decrypted correct version of the encrypted data word.

According to an embodiment of a device for protecting an encrypted data word, the device includes a determiner and an updater. The determiner is configured to determine an error correction code $cv_A$ associated with an encrypted data word a so that $cv_A=aA^T$, with A being a generator matrix of a linear systematic base correction code, the columns of which enable performance of a single-bit error correction and a double-bit error detection on replica of the encrypted data word a and the associated error correction code $cv_A$. The updater is configured to update a predetermined one of w further encrypted data words forming, along with the encrypted data word a, a set of w+1 encrypted data words, so as to correspond to a mod-2 sum of the predetermined encrypted data word, the encrypted data word a and a previous version of the encrypted data word a, and update the error correction code associated with the predetermined encrypted data word so as to be equal to the predetermined encrypted data word times $A^T$.

According to an embodiment of a method of error correction, the method includes receiving a data word a and an error correction code $cv_A$ associated with the data word a, and declaring the data word a as being correct if $cv_A$ equals $aA^T$, with A being a generator matrix of a linear systematic base correction code. The method further includes performing, if $cv_A$ is unequal to $aA^T$, an x-bit error correction on the data word a and the associated error correction code $cv_A$ using columns of A in order to obtain a corrected version of the data word a and the associated error correction code $cv_A$ in the case of the x-bit error correction being successful, and assuming a number of corrupted bits of the data word a and the associated error correction code $cv_A$ to be greater than x and perform. The method also includes, if the x-bit error correction fails, obtaining an extension error correction code $cv_E$ and performing an y-bit error correction with y>x, on the data word a and the error correction code $cv_A$ using the extension error correction code $cv_E$ and columns of an extended matrix $$F = \begin{pmatrix} A \\ E \end{pmatrix}$$

of an extended linear systematic correction code according to which $(cv_A|cv_E)=aF^T$ if the data word a, the error correction code $cv_A$ and the extension error correction code $cv_E$ were correct.

According to an embodiment of a method of protecting a data word against data corruption, the method includes determining an error correction code $cv_A$ associated with a data word a so that $cv_A=aA^T$, with A being a generator matrix of a linear systematic base correction code, the columns of which enable performance of an x-bit error correction on replica of the data word a and the associated error correction code $cv_A$. The method further includes determining an extended error correction code $cv_E$ so that $(cv_A|cv_E)=aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y=x, on a replica of the data word a and the associated error correction code $cv_A$.

According to an embodiment of a method of error correction, the method includes receiving an encrypted data word a and an error correction code $cv_A$ associated with the encrypted data word a and declaring the encrypted data word a as being correct if $cv_A=aA^T$, with A being a generator matrix of a linear systematic base correction code. The method further includes performing, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code $cv_A$ so as to regard an error of the encrypted data word a to be a double-bit error or a more-than-two-bit error. The method also includes if the error of the encrypted data word a is regarded as a double-bit error, requesting a number w of further encrypted data words forming, along with the encrypted data word a, a set of w+1 encrypted data words, along with further error correction codes associated with the further encrypted data words, respectively, checking all of the further encrypted data words and the further error correction codes as to whether the same are correct, requesting a decryption of a correct version of the further encrypted data words in order to obtain a decrypted correct version of the further encrypted data words, requesting an encryption of a mod-2 sum of the decrypted correct version of the further encrypted data words to obtain a correct version of the encrypted data word, and comparing the encrypted data word and the correct version of the encrypted data word to prove that the error of the encrypted data word a is a double-bit error.

According to an embodiment of a method of protecting an encrypted data word, the method includes determining an error correction code $cv_A$ associated with an encrypted data word a so that $cv_A=aA^T$, with A being a generator matrix of a linear systematic base correction code, the columns of which enable performance of a single-bit error correction and a double-bit error detection on replica of the encrypted data word a and the associated error correction code $cv_A$. The method further includes updating a predetermined one of w further encrypted data words forming, along with the encrypted data word a, a set of w+1 encrypted data words, so as to correspond to a mod-2 sum of the predetermined encrypted data word, the encrypted data word a and a previous version of the encrypted data word a, and update the error correction code associated with the predetermined encrypted data word so as to be equal to the predetermined encrypted data word times $A^T$.

According to an embodiment of a computer readable medium storing a computer program configured to perform error correction, the computer program includes program instruction to determine an error correction code $cv_A$ associated with a data word a so that $cv_A=aA^T$ with A being a generator matrix of a linear systematic base correction code, the columns of which enable performance of an x-bit error correction on replica of the data word a and the associated error correction code $cv_A$. The computer program further includes program instructions to determine an extended error correction code $cv_E$ so that $(cv_A|cv_E)=aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y=x, on a replica of the data word a and the associated error correction code $cv_A$.

According to an embodiment of a computer readable medium storing a computer program configured to perform error correction, the computer program includes program instructions to receive an encrypted data word a and an error correction code $cv_A$ associated with the encrypted data word a and program instructions to declare the encrypted data word a as being correct if $cv_A=aA^T$, with A being a generator matrix of a linear systematic base correction code. The computer program further includes program instructions to perform, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code so as to regard an error of the encrypted data word a to be a double-bit error or a more-than-two-bit error. The computer program also includes program instructions to, if the error of the encrypted data word a is regarded as a double-bit error, request a number w of further encrypted data words forming, along with the encrypted data word a, a set of w+1 encrypted data words, along with further error correction codes associated with the further encrypted data words, respectively, check all of the further encrypted data words and the further error correction codes as to whether the same are correct, request a decryption of a correct version of the further encrypted data words in order to obtain a decrypted correct version of the further encrypted data words, request an encryption of a mod-2 sum of the decrypted correct version of the further encrypted data words to obtain a correct version of the encrypted data word, and compare the encrypted data word and the correct version of the encrypted data word to prove that the error of the encrypted data word a is a double-bit error.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 11 shows a schematic diagram of protected data and its associated redundancy data in accordance with the embodiment of FIG. 10;

DETAILED DESCRIPTION

Figure 1:
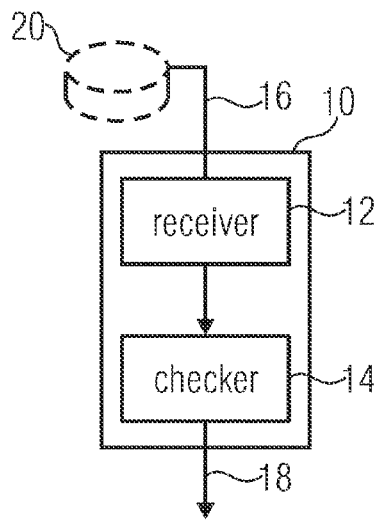
FIG. 1 shows a block diagram of an error correction device in accordance with an embodiment.

Before several embodiments for data correction and protection are outlined in more detail below, an illustrative explanation shall be given in order to motivate, and make clear, advantages of the embodiments described further below. As already mentioned above, redundancy has to be added to data which is to be protected against data corruption. The amount of redundancy to be added depends on the number of bits within a single data word, which is to be still correctable. The higher this number of bits, the more redundancy has to be added. Put differently, the mean number of bits corrupted in a data word depend on the size of the data word; the greater the data word, the higher the mean number of data bits corrupted therein. That is, the greater the size of the data words, the worse the code rate of the correction code gets, i.e. the higher the number of bits necessary in order to render the data word correctable at a certain predefined probability. However, data words of greater size result in disadvantages in terms of data latency. If, for example, merely a minor portion of the data word protected is of interest for the recipient, despite this the whole data word along with its redundancy has to be subject to the data error correction and detection capability. The below outlined embodiments yield a possibility for a better tradeoff between data protection and data latency and/or coding rate. Bit errors involving less than or equal to x bits, such as single-bit errors, can be detected and corrected data wordwisely based on the data word and its associated error correction code itself. However, bit errors involving more than these x bits, such as double-bit errors, may be corrected as well.

In accordance with one aspect of the embodiments outlined below, this is achieved by accompanying the error correction code associated with a data word via a linear systematic base correction code, with an extension error code of an extended linear systematic correction code according to which the data word a and the error correction code $cv_A$ is correct, if $cv_A = aA^t$, with A being a generator matrix of a linear systematic base correction code. An extended matrix of the extended linear systematic correction code is $$F = \begin{pmatrix} A \\ E \end{pmatrix}.$$

According to the extended linear systematic code $(cv_A | cv_E) = aF^T$ if the data word a, the error correction code $cv_A$ and the extension error correction code $cv_E$ were correct. That is, the extension error correction code is not added to the data word a and the error correction code $cv_A$ completely anew. Rather, a hierarchy among the linear systematic base correction code in the extended linear systematic correction code is exploited, thereby decreasing the redundancy to be additionally spent for the ability of correcting further bits. By this measure, even the amount of correction overhead scales with the error statistic of the data words. In most application cases, the number of bit errors within a data word monotonically get less probable. Accordingly, at a higher probability, the error correction code $cv_A$ suffices in order to perform the error detection or error correction if necessary. Merely in the remaining cases, the additional extension error correction code is necessary in order to attempt in correcting a higher number of bit errors.

In accordance with a further embodiment, the data words are grouped into sets of data words with merely using one extension error correction code to check some of the extension error correction codes of the data words of the respective set. This further reduces the amount of data necessary for the redundancy.

In accordance with further embodiments also described below, the tradeoff between protection capability and data latency and/or code rate increase is achieved by associating a set of encrypted data words with an error correction code $cv_A$ allowing for a single-bit error correction and a double-bit error detection, with additionally providing this set of data words with an additional data word and an additional error correction code representing a mod-2 sum of the encrypted data words and their error correction codes of that set. By this measure, single-bit errors are easily detectable and correctable without extra measures. On the other hand, a double-bit error within one of the encrypted data words is still correctable via a detour crossing the boundary between encrypted domain and decrypted domain. Thus, the latter embodiments are particularly advantageous in cases where the data words to be protected are available in an encrypted form, and where a decryption module is involved in decrypting the data words. Again, even in these latter embodiments, the amount of overhead necessary in order to gain access to the data word content is adapted to the probability distribution of the number of bit errors occurring in the data words. In many application cases, merely a few bits are corrupted. In these cases it is very likely that an encrypted data word may be corrected individually in the encrypted domain in case merely a single-bit error is present. In case of a seldom occurring double-bit error, it is at least worthwhile to try to correct the double-bit error by the detour via the encryption/decryption domain boundary using the other encrypted data words and their associated error correction codes.

FIG. 1 shows a device 10 for error correction. The device 10 includes a receiver 12 and a checker 14. Both are connected in series to each other in the order mentioned between an input 16 and an output 18 of the device 10. For ease of understanding of the following description of the mode of operation of the device 10, the device 10 is shown to be connected to memory 20 having stored therein data words protected by use of redundancy as outlined below and as exploited by the device 10 for error correction also as described below.

Figure 2:
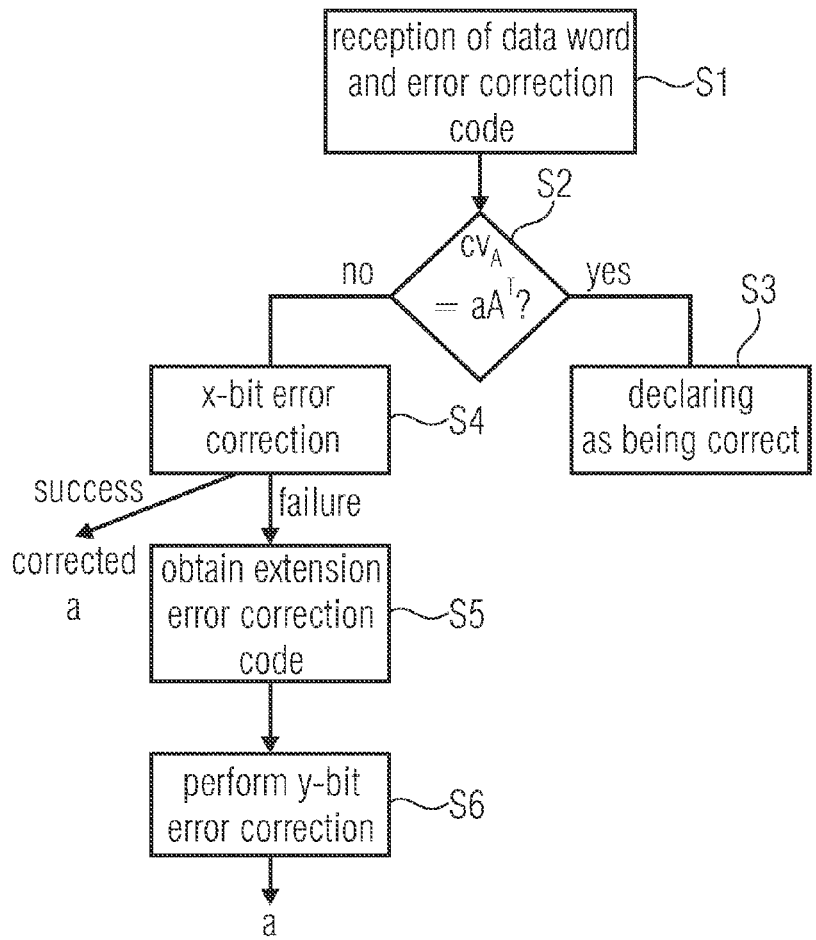
FIG. 2 shows a flow diagram of the mode of operation of the error correction device of FIG. 1 in accordance with an embodiment.
Figure 3A:
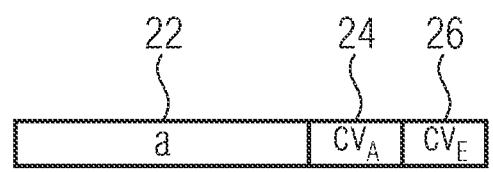
FIGS. 3a and 3b show schematic diagrams of data words and its associated redundancy data in accordance with different embodiments.

In particular, the mode of operation of the device 10 described in the foil wing with respect to FIG. 2. For ease of understanding, the description of the mode of operation of the device 10 of FIG. 1 focuses on the functionality of the device 10 with respect to the performance of error correction with respect to a specific data word stored in the memory 20. Primarily, it is assumed that the data word a (22) has redundancy associated therewith and stored in memory the 20 as shown in FIG. 3a, although there are other possibilities as well, among which one is specifically outlined with respect to FIG. 3b.

In particular, the receiver 12 is configured to receive the data word a and an error correction $cv_A$ (24) associated with the data word a in step S1, thereby starting a respective process of performing an error correction on the data word a. Although in accordance with FIG. 1, the receiver 12 is shown and described as receiving the data word a from the memory 20, alternative embodiments are possible as well, such as reception from a respective transmitter such as a wireless transmitter, or from a data bus. The data word a received in step S1 may have been passed on from the memory 20 to the receiver 12 on demand, such as a demand issued by a recipient connected to the output 18, which is not shown in FIG. 1, but could be a CPU (central processor unit), for instance. Alternatively, the data word a may be part of a unidirectional transmission such as a broadcast or multicast signal comprising, for instance a stream of data words a. The sort of data content represented by the data word a is also not restricted to any particular kind of information. The information transferred via the data word a may, for example, comprise program instructions or a program code, secret data such as an encryption/decryption key, personal user data, video or audio data, or other multimedia data, or any other sort of data.

The checker 14 is configured to check as to whether $cv_A=aA^T$, with A being a generator matrix of a linear systematic base correction code. A specific example for generator matrix A is presented in embodiments described in more detail below. Generally speaking, the linear systematic base correction code may, for example, be a linear block code allowing for an x-bit correction. In the following specific examples x=1.

In other words, the checker 12 assumes that the error correction code $cv_A$ associated with the data word a as received from the memory 20 has been computed such that $cv_A=aA^T$. Accordingly, if neither the data word a nor the error correction $cv_A$ is corrupted, the check in step S2 results in equality. In response, the checker 14 declares the data word a as being correct in step S3. Otherwise, the checker 14 is configured to perform, if $cv_A$ is unequal to $aA^T$, an x-bit error correction on the data word a and the associated error correction code $cv_A$ using columns of A in step S4 in order to obtain a corrected version of the data word a in case of the x-bit error correction being successful, and assumes a number of corrupted bits of the data word a and the associated error correction code $cv_A$ to be greater than x if the x-bit error correction fails. As will be outlined in more detail below, the process of x-bit error correction in step S4 as performed by the checker 14 may involve an evaluation of a syndrome or check vector corresponding to a mod-2 sum of the error correction code $cv_A$ and $aA^T$ in accordance with certain rules of the x-bit error correction. Applying the rules onto this syndrome or check vector may lead to abort situations where the x-bit error correction has to be interrupted unsuccessfully, thereby making clear that more than x-bits are corrupted within the data word a. If no such abort situation occurs, the x-bit error correction may be finished successfully, thereby revealing or obtaining a corrected version of the data word a in which case the checker 14 may output this corrected version as the output 18.

In case of the failure situation, the checker 14 may, as indicated above, assume that the number of corrupted bits of the data word a and the associated error correction code $cv_A$ exceeds x. In accordance with embodiments outlined in more detail below, the checker 14 and the base correction code may be configured such that the checker 14 can check whether the number of corrupted bits is $\leq y$, or not, and to cease processing in case of the number of corrupted bits exceeding y. However, this check is optional.

The checker 14 then obtains an extension error correction code $cv_E$ (26) in step S5. Similar to the above discussion with respect to the various options which exist for implementing the reception in step S1, the obtaining step S5 may involve the checker 14 requesting, by demand, respective further information from the memory 20 or some other data source, or the extension error correction code 26 may be passed onto the receiver 12 automatically or unavoidably with the checker 14 ignoring this extension error correction code 26 in case the x-bit error correction failure situation does not occur.

Although FIG. 3a suggests that the storage positions of data items 22, 24 and 26 may be such that all these data items physically or virtually abut each other, this is not necessarily the case. The association between these data items may be guaranteed in alternative ways such as by use of same indices in separated lists, by use of pointers or the like. In other words, the association may be determined by syntax or by some other means. As will become clearer from the following description, the data word a (22) forms, along with its associated error correction code $cv_A$ (24), a systematic codeword of the afore-mentioned linear systematic base correction code, whereas the data word 22 along with both the error correction code $cv_A$ and the extension error correction code $cv_E$, form a systematic codeword of another extended linear systematic correction code according to which $(cv_A|cv_E)=aF^T$ if the data word a, the error correction code $cv_A$ and the extension error correction code $cv_E$ were correct. Accordingly, after step S5, the checker 14 performs an y-bit error correction with y>x on the data word a and the error correction code $cv_A$ using the extension error correction code $cv_E$ and columns of an extended matrix $$F = \begin{pmatrix} A \\ E \end{pmatrix}$$

of the extended linear systematic correction code in step S6. The result of step S6 is a corrected data word a. In particular, the latter corrected data word a is correct provided the number of corrupted bits has not accidentally exceeded y.

Thus, depending on the specific type of data source, such as the memory 20, it may be most likely that the process for performing error correction and detection on the data word a finishes at step S3, with the next probable finishing situation being the x-bit error correction in step S4 being successful, and with the last probable situation at which the process ends, being the failure situation involving steps S5 and S6. Advantageously, the amount necessary for the second-stage protection exploited in step S5 and S6, merely involves a minor amount of data, namely data 26, since the respective matrix F of this second-stage systematic correction code merely represents an extension of the generator matrix of the base correction code.

As will become clear from the following embodiments, the linear system base correction code may be a single-bit error-correction and double-bit error detection code with x=1 and y=2. Further, the matrix E may extend the columns of H=(A|I) such that the columns of $$\begin{pmatrix} A & I \\ E & O \end{pmatrix}$$

are pair-wise different, and no sum of any pair of columns of $$\begin{pmatrix} A & I \\ E & O \end{pmatrix}$$

equals another sum of another pair of columns of $$\begin{pmatrix} A & I \\ E & O \end{pmatrix},$$

where the symbol I represents the unity matrix of appropriate size and O represents the zero matrix of appropriate size.

If the data word or the encrypted data word a is of a length of n bit and the error correction code $cv_A$ is of a length of k bit, then k and n may be selected such that $k=\lceil \log_2(n+1) \rceil$ and the checker 14 may be configured such that A is a matrix with k rows and n columns.

Until now, the above discussion suggested that step S5 in FIG. 2 involves obtaining the extension error code 26 directly, i.e. in the same way as the data word a and the error correction code $cv_A$ are received. However, in the following, an alternative embodiment is described with respect to FIG. 3b, according to which the checker 14 is specifically configured to perform the obtaining of the extension error correction code in step S5, in a way taking into account other data words forming, along with the data word of interest, a predetermined set of data words.

Figure 3B:
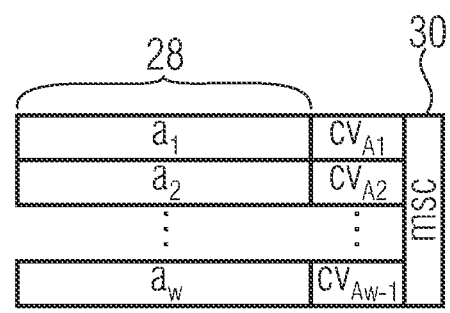

As shown in FIG. 3b, the data word a of interest, i.e. the one for which the data error correction/detection is currently to be performed, forms one of a set of w data words $a_1$ to $a_w$ with, for the sake of illustration only, data word $a_2$, for example, representing the data word a of interest, i.e. data word 22 as mentioned before with respect to the embodiment of FIG. 3b. Each of these data words $a_i$, with i=1 . . . w, has a respective error correction code $cv_A$ associated therewith just as described with respect to the data word 22 with respect to FIG. 3a. All this data is accessible by the checker 14 when entering step S5. The checker 14 is configured to, in obtaining the extension error correction code $cv_E$ in step S5, request the number w−1 of remaining data words $a_i$ except the data word of interest already having been received in step S1, and the associated error correction codes $cv_{A_i}$. However, as shown in FIG. 3b, in accordance with the embodiment of FIG. 3b, it is not necessary to render an extension error correction code $cv_E$ accessible for, or available to, the checker 14. Thus, in case of storing the data words, it is not necessary to store all these extension error correction codes $cv_E$ for all these data words of the data set 28. Rather, merely an extension error correction code check sum msc (30), with msc being the mod-2 sum of all $cv_E$, is associated with the set 28 of data words $a_i$ and requested by the checker 14 at step S5. As already described above, these requests may be output by the checker 14 in the form of a demand to the memory 20. Alternatively, the extension error correction code check sum msc may be forwarded to the checker 14 by the receiver 12 and the input 16 automatically with the checker 14 disregarding this information in case the x-bit error correction failure situation does not take place.

The checker 14 then checks all of the further data words $a_i$ and the associated error correction codes $cv_{A_i}$ as to whether same are correct or correctable by the x-bit error correction in the same manner as described above with respect to the data word of interest, such as data word $a_2$, i.e. analogously to the description of steps S2 to S4. If all of the further data words $a_i$ and the associated error correction codes $cv_{A_i}$ are correct or correctable, i.e. $cv_{A_i}=a_i A^T$ holds true or merely x bit or less are corrupted, the checker 14 derives the extension error correction code $cv_{E_i}$ for the correct (such as corrected by x-bit error correction) version of each of the further data words $a_i$ so as to obey $(cv_{A_i}|cv_{E_i})=a_i F^T$. Thus, if the data word of interest was data word $a_2$, then the checker 14 would perform steps S2 to S4 onto all pairs of data words a and associated error correction code $cv_{A_i}$ with i≠2. If no x-bit error correction failure situation results for any of these further data words $a_i$ with i≠2, then all these pairs of data words $a_i$ and associated error correction codes $cv_{A_i}$ with i≠2 would be correct (maybe corrected) and enable a derivation of the correct version of the extension error correction code $cv_{E_i}$ in accordance with the just mentioned formula. The checker 14 can then obtain the extension error correction code $cv_E$ for the data word of interest, i.e. $a_2$. The checker 14 uses a mod-2 sum of the extension error correction code $cv_{E_i}$ of the further data words $a_i$ with i≠2 and the extension error correction code check sum msc as the extension error correction code $cv_{E_2}$ of the data word $a_2$ of interest. Thus, although merely a minor amount of data is to be reserved for the msc (instead of a data item 26 for each of the data words in set 28), a correction of an y-bit error n one of the data words in set 28 is still possible.

However, if any of the further data words $a_i$ with i≠2 and the associated error correction code $cv_{A_i}$ are not correctable by the x-bit error correction, then the checker 14 may declare the data word a and the associated error correction code $cv_A$ as not being correctable using the y-bit error correction and the process stops at step S5. As has been described above, the checker 14 may be configured to, in requesting the number w−1 of further data words $a_i$, the associated error correction code $cv_{A_i}$ and the extension error correction code check sum msc, send read commands to the memory 20 to read the further data words $a_i$, the further error correction code $cv_{A_i}$ and the extension error correction code check sum msc from the memory 20, or alternatively, some data source other than the memory 20.

The checker 14 may be configured to support sets of data words with different w's. For example, different sets of data words may be used for different physical storage portions of the memory 20. For example, the memory 20 may be a non-volatile memory, such as a flash memory or a EEPROM. However, the memory 20 may also include a combination of different types of memories, such as a selection of one or more of an RAM, ROM, flash-memory, EEPROM, hard drive, CD drive, DVD drive, magnetic tape drive or the like. For different memory types, different may be used. However, the boundary between different w's may also be placed differently, such as within the virtual domain of memory addresses or between data words concerning differing content, such as more important and less important content. In case of a transmitter as data source, the different portions associated with different w's may correspond to different portions defined by syntax, such as different layers of a scalable data stream of the like.

After having described various embodiments with respect to FIGS. 1 to 3b, a further embodiment complying with a variant according to FIG. 3b and being adaptable to the variant of FIG. 3a, is described in the following with explicit examples for the above mentioned matrices A and E, respectively. The embodiment explained below provides, just as the above-outlined embodiments do, a hierarchical and scalable error correction for memory data stored in a RAM, ROM, flash-memory, EEPROM or other types of memory such as hard drives, CD drives, DVD drives or magnetic tape drives. Single-bit errors can be detected and corrected directly after every read of a data word of interest, whereas all double-bit errors and higher-order errors are corrected after additional read operations. In this approach, fault-free data and data with single-bit errors can be read from a memory without additional read operations. The required overhead for the correction of double-bit errors can be scaled/traded with the amount of additional read operations necessary to perform the correction. The scaling is performed by use of w between the embodiment of FIGS. 3a and 3b, as will also be described below. Just as it is true for the above-outlined embodiments, the embodiment outlined below combines small read granularity and single-bit error correction with an efficient additional implementation of double-bit or higher-bit error correction. Again, the memory application merely serves for illustration purposes, and all these explicit embodiments described in the present application are also transferable to other applications where the data to be protected stems from other data sources.

In accordance with the embodiments outlined below, a specific extended double-bit error correction code is constructed that contains a stand-alone single-bit error correcting and 2-bit error detecting sub-code. Separate use of this embedded sub-code is hierarchically made to correct single-bit errors on one data granularity and to only use the extended code to correct double-bit errors on another granularity which may be larger as explained with regard to FIG. 3b. Thus, independent scaling of single-bit error correction capabilities and double-bit error correction capabilities is possible.

In the specific embodiment described below, a systematic linear code capable of single-bit error correction and simultaneously capable of double-bit error detection is used. For an n-bit input data vector a, a k-bit check vector $cv_A$ is computed by multiplying the vector a with the transpose $A^T$ of some matrix A that defines the error correction code (all in modulus-2 arithmetic): $cv_A = aA^T$.

The matrix A with k rows is now extended in a special way described further below with a matrix E with l rows to get a new matrix $$F = \begin{pmatrix} A \\ E \end{pmatrix}.$$

The matrix F with k+l rows describes a code that can be utilized to compute a check vector $cv_F = aF^T$, which can be utilized to correct double-bit errors in a code word ($a|cv_A$), where $cv_F = (cv_A|cv_E)$. The code word for the extended code is ($a|cv_F$) = ($a|cv_A|cv_E$).

The so called control matrices used for error detection and correction are for the standard sub-code: H=(A|I) and for the extended code: R=(F|I), where the symbol I represents the unity matrix of appropriate size.

The matrix R has the form $$R = \begin{pmatrix} A & I & 0 \\ E & 0 & I \end{pmatrix},$$

where 0 represents the zero matrix of appropriate size. The columns of the matrix R should be distinct, i.e. pairwise different.

Moreover, the matrix E is constructed in such a way that all the possible sums of any two columns of its sub-matrix $$G = \begin{pmatrix} A & I \\ E & O \end{pmatrix}$$

are also pairwise different, E is chosen in such a way that the (modulo 2) sum of any two columns of G is different to the sum of any other two columns of G. Later on this will ensure that any double-bit error in a code word (a|cv$_A$) can be identified and corrected using the code defined by matrix R.

It is noted, that errors in cv$_E$ cannot (and as will be described below need not) be identified.

Figure 4B:
FIG. 4 shows matrices involved with an embodiment described with respect to FIGS. 5 and 6.

The systematic linear base code according to the current specific embodiment defined by A and H respectively, is shown in FIG. 4. The extended special linear code is defined by $$F = \begin{pmatrix} A \\ E \end{pmatrix} \text{ and } R = \begin{pmatrix} A & I & 0 \\ E & 0 & I \end{pmatrix} = \begin{pmatrix} G & 0 \\ & I \end{pmatrix},$$

respectively, for which a possible implementation is also shown in FIG. 4.

As described above, the sub-matrix E is chosen in such a way that the sum of any two of the first 39 columns of R is different to the sum of any other two of these columns.

The last 5 columns of R may not be included in this property. This leads to a more efficient implementation as it gets tendentially smaller. In other words, the extension error correction code cv$_E$ may have a length of l bits, and a check matrix $$R = \begin{pmatrix} A & I & 0 \\ E & 0 & I \end{pmatrix}$$

of the extended linear systematic correction code may have along its right-hand side outmost l columns at least one column which, added with another column of R yields a sum of a different pair of columns of R.

Advantageously, the base systematic linear code capable of single-bit error correction and double-bit error detection is embedded into the special extended code. This saves bits to be spent for msc or cv$_E$, respectively.

As far as the possible selections of n and l is concerned, same may be selected such that $\log_2((n+l)*(n+l-1)/2) \leq n+l$. Further, as mentioned before, k and n may be selected such that $k = \lceil \log_2(n+1) \rceil$.

Although a specific embodiment is shown in FIG. 4, many alternatives exist for matrices A and E, respectively.

According to the specific embodiment, the device 10 may make use of the above matrices to protect memory data in the following way. Assume a block of w words with n bits each is to be stored in the memory 20. For every word $a_i$ with i=0 . . . w−1 a check vector cv$_{Fi}$=ai $F^T$=(cv$_{Ai}$|cv$_{Ei}$) is computed. The following data is stored in the memory:

w extended words (ai|cv$_A$) with n+k bits each; and msc=the modulo 2 sum of all cv$_{Fi}$ (i=0 . . . w−1) with l bits.

Figure 5:
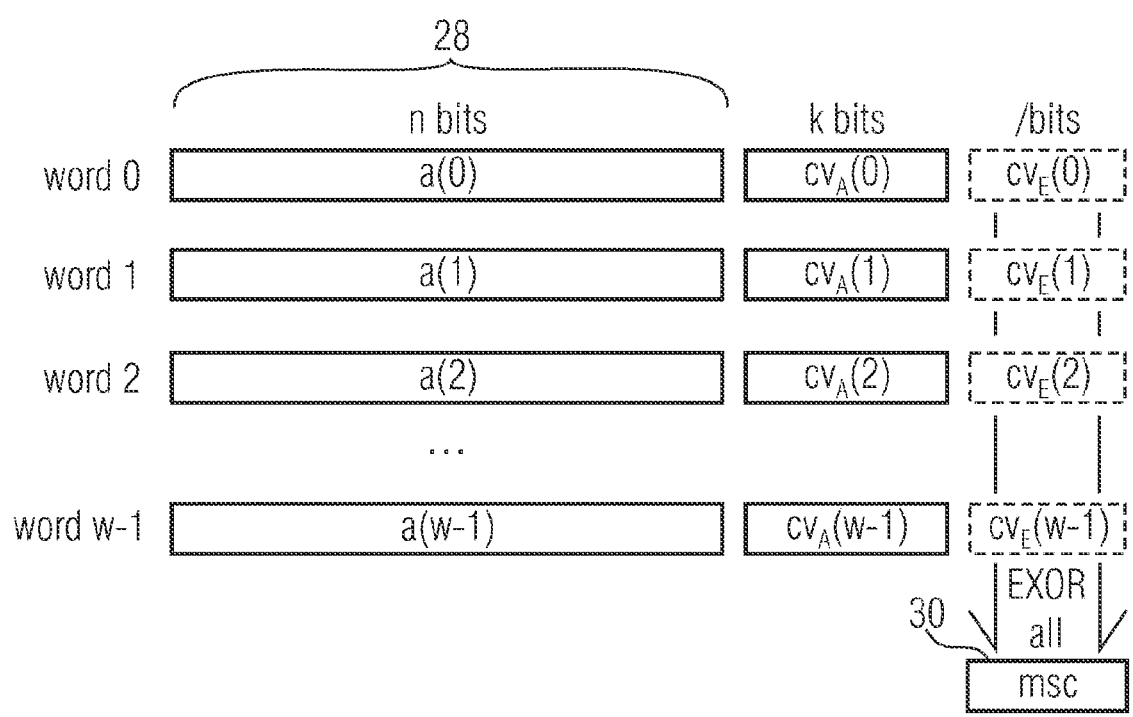
FIG. 5 shows a schematic diagram illustrating data words to be protected and its associated redundancy data in accordance with an embodiment.

This procedure, and the resulting storing situation, is depicted in FIG. 5. In particular, the blocks in FIG. 5 with solid lines indicate values written to the memory 20, while the blocks with dashed lines indicate intermediate values not stored in the memory 20. When a word ar is to be read from the memory 20, the device 10 does the following:

1. Read extended word (ar*|cv$_{Ar}$*) from memory 20, where "*" indicates potentially distorted values (c.f. step S1 of FIG. 2);

2. Use standard code with control matrix H=(A|I) to detect/correct errors:

A) If the syndrom vector s=H (ar*|cv$_{Ar}$*)$^T$=0, (c.f. step S2 of FIG. 2)

correct data is assumed and no further steps are necessary;

the read word ar=ar* is assumed to be correct (c.f. step S3 of FIG. 2);

B) If the concrete syndrom vector s=H (ar*|cv$_{Ar}$*)$^T$≠0 indicates a single-bit error, a single-bit error is assumed and the single-bit error is corrected using the standard code and no further steps are necessary; the read word ar is assumed to be correct after the correction. (c.f. step S4 of FIG. 2);

C) if the concrete syndrom vector s=H (ar*|cv$_{Ar}$*)$^T$≠0 indicates a double-bit error, a double-bit error is assumed and the following procedure is executed: (a-c: c.f. step S5 of FIG. 2; d: c.f. step S6 of FIG. 2)

a) In a loop over all w−1 remaining extended words of the block (j=0 . . . w−1; j≠r)

read (aj*cv$_{Aj}$*).

If sj=H (aj*cv$_{Ai}$*)$^T$=0 or if s=H (aj*|cv$_{Aj}$*)$^T$≠0 indicates a single-bit error, aj* is corrected.

If sj=H (aj*|cv$_{Aj}$*)$^T$≠0 indicates a double-bit error, no correction of (ar*|cv$_{Ar}$*) is possible, since more than two words in the block contain at least double-bit errors.

Figure 6:
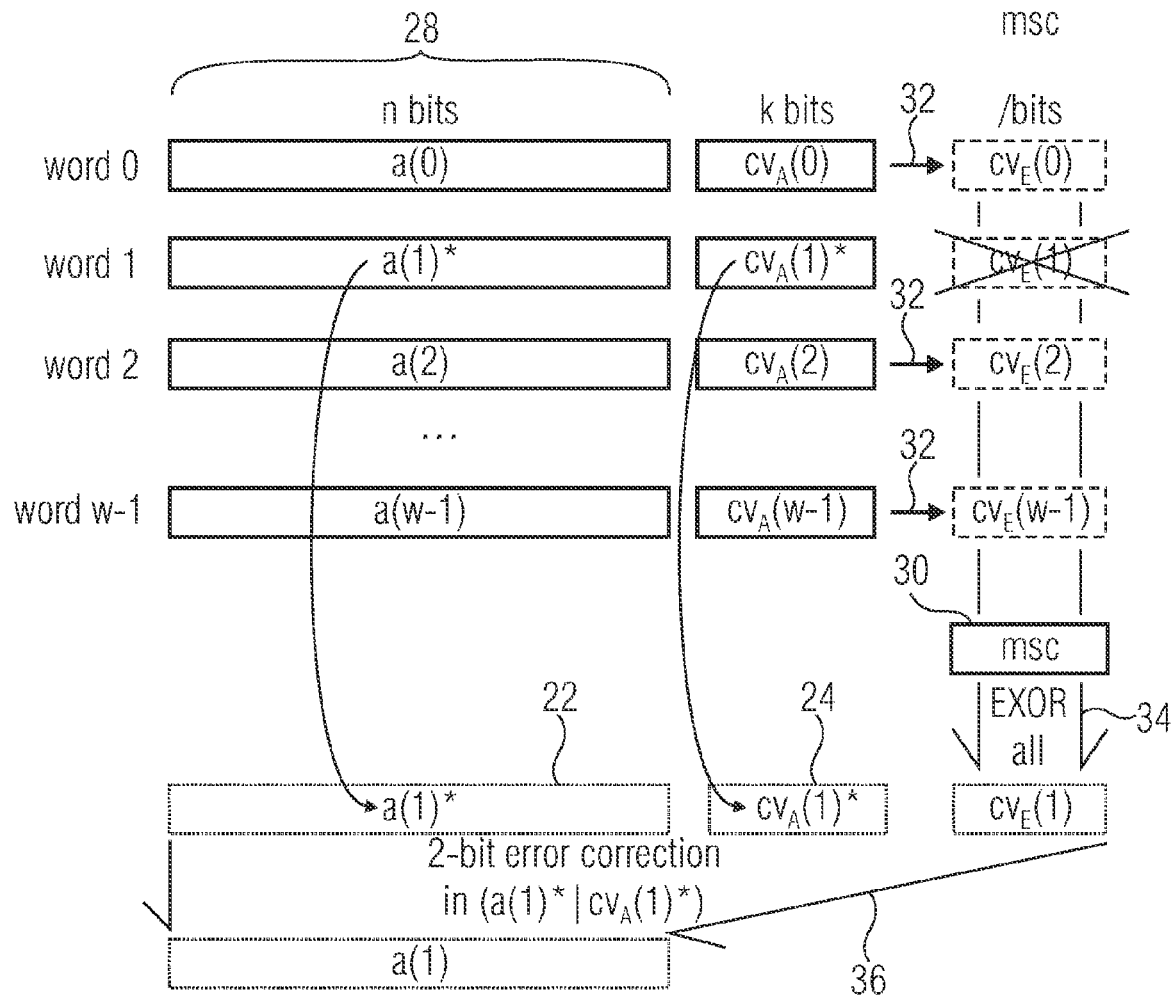
FIG. 6 shows a schematic diagram of the data words of FIG. 5 with additionally illustrating intermediate data intermediately obtained when error correcting one of the data words in accordance with an embodiment.

Compute cv$_{Ej}$ from cv$_{Fj}$=(cv$_{Aj}$|cv$_{Ej}$)=aj $F^T$. (see 32 in FIG. 6)

b) Read msc from the memory.

c) Compute modulo-2-sum of msc and all cv$_{Ej}$ (j=0 . . . w−1; j≠r) to get cv$_{Er}$. (see 34 in FIG. 6)

d) Correct error in ar* using the double-bit error correcting code R (ar*cv$_{Ar}$*|cv$_{Er}$)$^T$, (see 36 in FIG. 6)

This procedure is also depicted in FIG. 6 for the example r=1.

The "If" operations performed in lines A), B), and C) above are the operations known from the evaluation of the base systematic linear code with single-bit error correction and double-bit error detection. Only the steps a) . . . d) involve the extended systematic code.

The correction scheme neither requires to protect and thus read large words, nor imposes an overly large overhead caused by a large percentage of additional check bits.

As long as none of the relatively low probable double-bit errors occurs, small words with direct single-bit error correction are read, which is especially more power efficient than to always read all bits required for double-bit error correction. Only when really a double-bit error is detected during a read operation, extra read operations may be used to perform the correction.

By adapting the number of words w in a block, the probability of being able to correct a double-bit error can be scaled independent of the correction of single-hit errors. The relative overhead (measured in required extra memory bits) for double-bit error correction compared to single-bit error correction is o$_{ecc2}$=l//(w*(n+k)) (where "*" here indicates integer multiplication). With large w, o$_{ecc2}$ can become very small. (For traditional codes: o$_{ecc2}$≈l//(n+k).)

For the example code described above with n=32, k=7, l=5, and w=4: o$_{ecc2}$=3.2%, doubling w to w=8 gives o$_{ecc2}$=1.6%. This shows that the overhead o$_{ecc2}$ on one side can be traded against the number of additional read operations in case of a double-bit error (w−1) and against the probability for the correction of a word.

The larger a block, the larger the probability that more than one of its words has a double-bit error, which makes it impossible to correct the double bit error-incriminated words.

The following variants are possible:

For example, w may be set to be w=1, i.e. protection of one word only. This corresponds to the above FIG. 3a. Here, the advantage lays, for example, in the power saving of not always reading the full set of n+k+l bits, but only reading the l bits when it is necessary, i.e. when an double-bit error is detected in the n+k bits read first;

For example, w may be set to be w=$2^x$, i.e. block granularity "power of 2";

Different w, i.e. different block sues, for different data sections in a single memory may be used.

For an exemplary EEPROM: small w for data that is cycled (erased and re-written) very often, so that same are better protected against double-bit errors. Larger w may be used for constant data. This minimizes the overhead $o_{ecc2}$, and:

n may be set to be n=$2^x$, i.e. data widths "power of 2";

the data words need not to be stored in a memory, but instead, data in a communication could be protected, such as data on a data bus, on a chip or the like.

Any inversion of a set of bits consistently done during writing and during reading of the data does not harm the scheme. This can be employed to e.g. make a completely erased memory ECC-clean. Further, an even deeper embedding of code may be achieved. That is, more levels of hierarchy than two levels may be provided.

For all the above-outlined embodiments, and also for the following embodiments, these embodiments relay be used in connection with flash or EEPROMs. Further, with respect to the device 10 and its internal elements, namely the receiver 12 and the checker 14, the same may be implemented by dedicated hardware, by a CPU with suitable software or by any other combination of hardware or software such as, for example, firmware, i.e. programmable hardware such FPGA or the like.

Figure 7:
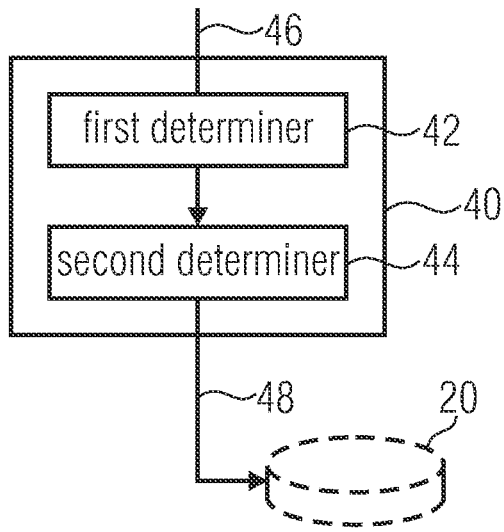
FIG. 7 shows a block diagram of a device for protecting a data word against data corruption in accordance with an embodiment.
Figure 8:
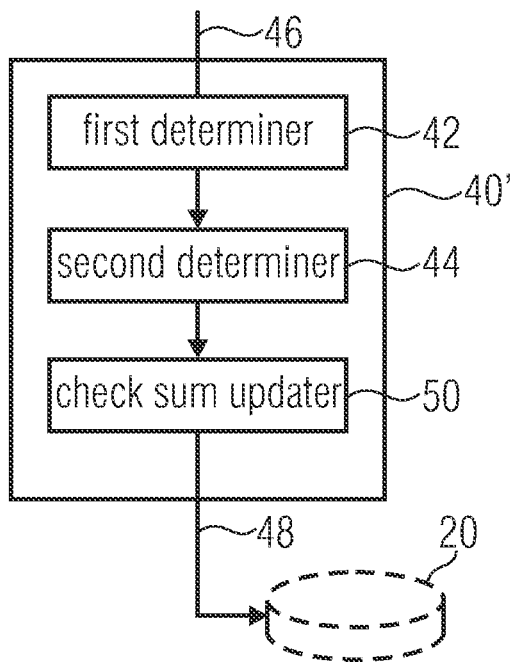
FIG. 8 shows a block diagram of a device for protecting a data word against data corruption in accordance with a further embodiment.

Before turning to another embodiment, reference is made to FIGS. 7 and 8 to describe embodiments of devices for protecting a data word against data corruption in a way so that the protection is exploitable by any of the above-mentioned embodiments. The mode of operation in protecting a data word has briefly been mentioned in the above discussion of FIG. 5 with respect to the treatment of a whole set of data words, but despite this, specific embodiments for a device for protecting a data word against data corruption are presented in FIGS. 7 and 8.

FIG. 7 shows a device 40 for protecting a data word against data corruption. The device 40 includes a first determiner 42 and a second determiner 44 which are connected in series between an input 46 and an output 48 of the device 40 in the order mentioned. As illustrated in FIG. 7, memory 20 may be connected to the output 48. That is, the device 40 may, as just mentioned, be configured to store data word a into the memory 20 along with an error correction code $cv_A$ such that the device 10 of FIG. 1 may perform the above-mentioned error correction/detection thereupon. The first determiner 42 may be configured to determine an error correction code $cv_A$ associated with the data word a so that $cv_A$=$aA^T$, with A being a generator matrix of a linear systematic base correction code, the columns of which enable performance of an x-bit error correction on replica of the data word a and the associated error correction code $cv_A$. The second determiner 44, in turn, may be configured to determine the afore-mentioned extended error correction code $cv_E$ so that $(cv_A|cv_E)$=$aF^T$, with F being an extended generator matrix $$F = \begin{pmatrix} A \\ E \end{pmatrix}$$

of an extended linear systematic correction code, the columns of which enable, using the extension error correction code $cv_E$, performance of the y-bit error correction, with y>x, on replica of the data word a and the associated error correction code $cv_A$.

As illustrated in FIG. 7, the first and second determiners 42, 44 may be configured to perform the respective determination in response to a write command stemming from, for example, a CPU or the like, wishing to store the data word a into the memory 20. In other words, the write command may instruct the data word a to be written into the memory 20. The device 40 may be configured to write the error correction code $cv_A$ to the memory 20 along with data word a.

FIG. 8 shows a device 40' differing from the device 40 of FIG. 7 in that the device 40' includes a check sum updater 50 connected between the second determiner 44 and the output 48. The check sum updater 50 may be configured to update an extension error correction code check sum msc (30) so as to correspond to a mod-2 sum of a previous version of the extension error correction code check sum, i.e. the precious value thereof which is to be updated, the extension error correction code $cv_E$ and a previous version of the extension error correction code $cv_E$ associated with the data word a. Consider, for example, data word $a_2$ of FIG. 3b is to be overwritten according to a certain write command, $a_2$ is the previous version, which is overwritten, and $a_2'$ is the current version to be written. Then, the check sum updater 50 overwrites the old version of data word $a_2'$ with a new version $A_2$ and overwrites the corresponding error correction code using the new version $cv_{A_2}$ corresponding to the new data word $a_2$ and overwrites and updates msc with the mod-2 sum of the old version of msc', the extension error correction code $cv_{E_2}'$ corresponding to the previous version of the data word $a_2'$ obtained so that $(cv_{A_2}'|cv_{E_2}')$=$a_2'F^T$ and the extension error correction code $cv_{E_2}$ obtained such that $(cv_{A_2}|cv_{E_2})$=$a_2F^T$, i.e. msc is updated so that msc→msc$\oplus cv_{E_2} \oplus cv_{E_2}'$. Thus, the device 40' is able to store the data words of a set 28 individually without having to recalculate all the extension error correction codes $cv_E$ for all the other data words as well. Rather, merely the extension error correction codes of the old and new versions of the data word of interest of set 28 are calculated and modulo-2 added to the old version of msc to be updated.

Figure 9:
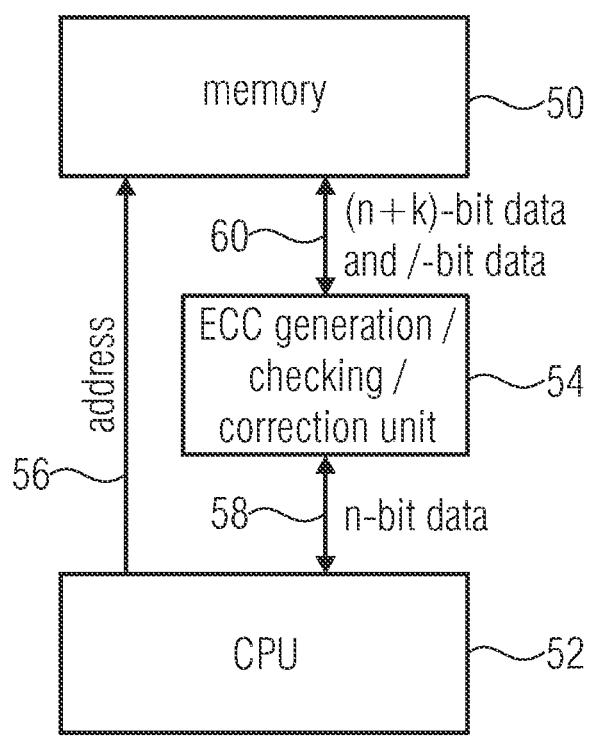
FIG. 9 shows a system in which error correction devices and protection devices in accordance with embodiments outlined herein may be employed.

FIG. 9 shows an embodiment of a system in which devices in accordance with embodiments as described above and as described below may be employed. The system includes a memory 50, such as the memory 20 mentioned before, a CPU 52 and an ECC (error correction code) generation/checking/correction unit 54 which corresponds to, in case of merely read capabilities with respect to the memory 50, the device 10, and in accordance with merely write capabilities, to the device 40 or the device 40', and in case of read and write capabilities, to a combination of the aforementioned devices. that the ECC unit 54 may similarly be implemented in accordance with any of the below-outlined devices in accordance with the embodiments described next. The CPU 52 is connected to the memory 50 via an address bus 56, the ECC unit 54 is connected into a data path between the memory 50 and the CPU 52. In particular, an data bus 58 connects the CPU 52 and the ECC unit 54, while a n+k data bus 60 may connect the memory 50 and the ECC unit 54 with some serial measure being used to update the msc value in case of embodiments of FIG. 3b, or the data bus 60 may be n+k +l-bits wide in case of FIG. 3a, for example.

Figure 10:
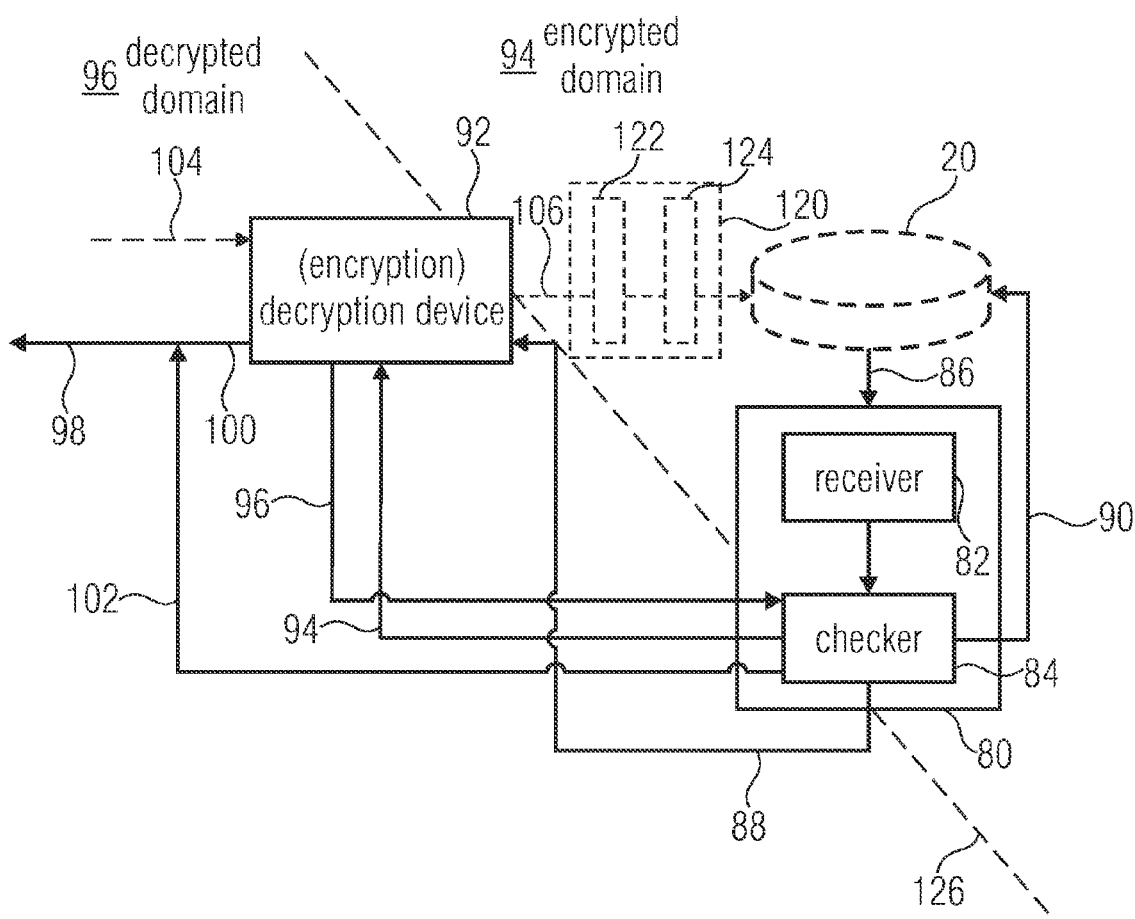
FIG. 10 shows a block diagram of an en/decryption system including an error correction device and/or a device for protecting a data word against data corruption in accordance with a further embodiment.

Turning now to FIG. 10, additional embodiments are described further below. In accordance with these embodiments, encrypted data words are protected. Again, the embodiments outlined below are primarily described with respect to stored encrypted data words although all these embodiments are easily transferable to applications where the data words are supplied by some other source such as by transferal on some data bus within a controller or the like. Generally, all of the statements regarding the generality of certain entities which occur in both the embodiments of FIGS. 1 to 8 on the one hand, and FIGS. 10 to 13 on the other hand, shall also apply to the embodiments outlined below, i.e. the embodiments of FIGS. 10 to 13. This is, for example, true for all the statements regarding w, the memory type, the properties of A and the like.

With this understanding, FIG. 10 shows a device 80 for error correction which includes a receiver 82 and a checker 84 connected in series and in the order mentioned between an input 86 and an output 88 of the device 80. Again, the memory 20 is shown as being connected to the input 86 as an example for a data source of the encrypted data words entering the input 86.

The encrypted data words could be indicated by the symbol "a", as this is the actual data, or the data in that domain, which is subject to data correction/detection. However, in order to keep the conformity with the afore-mentioned embodiments from the perspective of a recipient of the content of these encrypted data words, which is necessarily interested in the decrypted information of the data words rather than their appearance in the encrypted domain, the encrypted data words are denoted in accordance with a slightly different notation, namely as "ENC(a(0))", for example, as far as decrypted data word a(0) is concerned, where the function "ENC" shall represent the encryption function leading from the decryption data word a(0) to the encrypted data word ENC(a(0)), with $ENC^{-1}$ indicating the inverse thereof. The encryption and decryption functions may be highly non-linear functions. Accordingly, a single-bit error in an encoded data word, necessarily results in a multi-bit error in the decrypted domain.

As shown in FIG. 10, the checker 84 includes a request connection 90 to the memory 20 in order to request the provision of further encrypted data words as will be outlined in more detail below. The output 88 is connected to a decryption device 92 forming an interface between the encrypted domain 94 within which the memory 20 is positioned, and a decrypted domain 96 within which the recipient of the data word for which the error correction is performed, is positioned, such as, as outlined above, a CPU or the like.

As illustrated by parenthesis in FIG. 10, the decryption device 92 may also be capable of performing encryption. The checker 84 is also connected via a request connection 94 to the decryption device 92 in order to request decryption of a certain encrypted data word as will be outlined in more detail below. The decryption device 92 may output the decrypted data words the decryption of which has been requested the checker 84, to the checker 84 via a data connection 96. Similarly, the decryption device 92 can output decrypted versions of encrypted data words to an output 98 via a data connection 100 for encrypted data words having been identified as being correct or as having maybe a single-bit error in the encrypted domain 94 by the device 80 as will be described in more detail below. The checker 84 is also connected to the output 98 via a data line 102 for forwarding to the output 98 decrypted versions of data words which have to be subject to a double-bit correction as will be described below in further detail. As is shown by dotted lines in FIG. 10, in case of the decryption device 92 also having an encryption capability, the device 92 may receive data words to be encrypted and stored in the memory 20 via a data line 104 in order to output the respectively encrypted data words at a data output line 106 leading to the memory 20, but having connected thereinto a device 120 for protecting the respective encrypted data words output by the device 92. This device 120 includes a determiner 122 and an updater 124 connected in series to each other. Dashed line 126 in FIG. 10 illustrates a boundary between the encrypted domain 94 and the decrypted domain 96.

After having described an exemplary structure of the device 80 and its embedding into a data decryption or data encryption/decryption system along with the device 92, the mode of operation of the device 80 is explained further below with further regard to FIGS. 11 and 12, which show the data words available to the device 80 along with respective error correction code, i.e. here accessibly stored in the memory 20, and an exemplary process flow, respectively.

When the device 80 starts to error correct and perform error detection on a certain encrypted data word, a plurality of encrypted data words is available to the device 80. The encrypted data words are grouped into sets of encrypted data words, an example of which is shown in FIG. 11 with reference sign 128. The set 128 has w encrypted data words ENC(a(0)), ENC(a(1)), ..., ENC(a(w−1)) and ENC(a(w)). First w encrypted data words correspond to the set 28 of data words of the embodiment of FIG. 3b. That is, all these encrypted data words carry decrypted content in form of a(0), a(1), ..., a(w−1) and each has an error correction code $cv_A(0), \ldots, cv_A(w-1)$, respectively, associated therewith, so that the respective error correction code equals $ENC(a(\#))A^T$, with A being a generator matrix of a linear systematic base correction code just as previously described with respect to FIGS. 1-8. Instead of additionally providing an MSC as it was the case in FIG. 3b, an additional word is added to these w encrypted data words, namely the encrypted data word ENC(a(w)) forming an encrypted version of a mod-2 sum over all w encrypted data words ENC(a(0)) ... ENC(a(w−1)) as it is shown in FIG. 11. This additional encrypted data word ENC(a(w)) also has a respective error correction code $cv_A(w)$ associated therewith, so that $cv_A(w)=ENC(a(w))A^T$. The effect of this additional encrypted data word will become clear from the following discussion of FIG. 12.

Figure 12B:
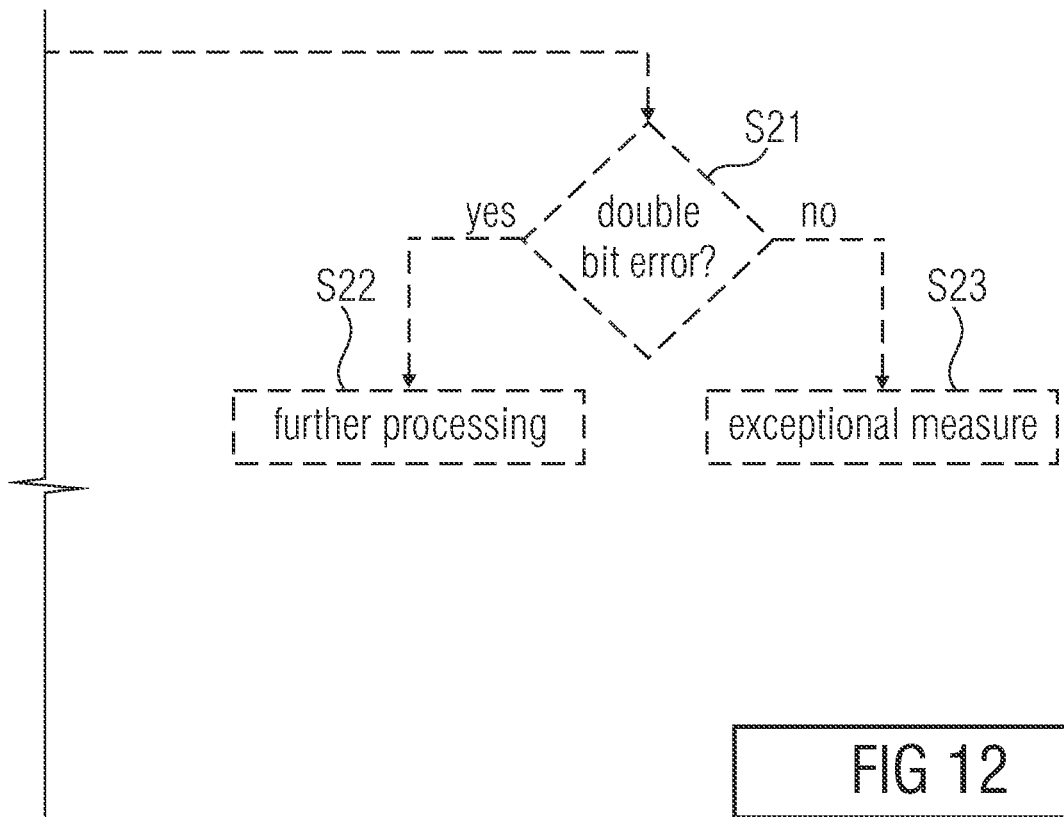
FIG. 12 shows a flow diagram of a mode of operation of the device of FIG. 10 in accordance with an embodiment.

The process starts at step S10 in FIG. 12 with the receiver 82 receiving an encrypted data word of interest along with an associated error correction code. For ease of understanding, it is assumed that this encrypted data word of interest is ENC(a(1)). The process of step S10 may have been triggered by the recipient connected to the output 98, such as a CPU as shown in FIG. 9, requesting a certain data word in decrypted form by sending a respective address via the address bus 56 to the memory 50 and 20, respectively.

Subsequently, the checker 84 checks whether the error correction code $cv_A(1)$ equals $ENC(a(1))A^T$ in step S11. If so, the checker 84 declares the encrypted data word as being correct in step S12, whereupon the checker 84 may forward this encrypted data word ENC(a(1)) via the output 88 to the decryption device 92 with notifying the latter via the connection 94 about its correctness. The device 92, in turn, decrypts the encrypted data word and sends the decrypted version thereof, i.e. a(1), to the output 92 via the connection 100 with using this outbound direction due to the correctness as indicated by the checker 84 via the connection 94 to the recipient.

If, however, the check in step S11 results in inequality, the checker 84 performs, using the columns of A, the single-bit error correction on the encoded data word ENC(a(1)) and its associated error correction code $cv_A(1)$ in step S13 as described previously with respect to step S4 in FIG. 2. In case of the single-bit error correction being successful, a corrected version of the encrypted data word ENC(a(1)) and the associated error correction code $cv_A(1)$ is obtained from the single-bit error correction step S13 and the checker 84 may act as outlined above with respect to step S12, i.e. by outputting the corrected version of the encrypted data word via the output 88 to the decryption device 92 with concurrently indicating its correctness to the device 92 via the connection 94 with the latter, in turn, decrypting the encrypted data word and outputting the decrypted version to the output 98.

If, however, the single-bit error correction in step S13 fails, the checker 84 performs a 2-bit error detection on the encoded data word ENC(a(1)) in step S14 and the associated error correction code $cv_A(1)$, so as to regard an error within the encoded data word ENC(a(1)) and the associated error correction code $cv_A(1)$ to be a double-bit error or a more-than-two-bit error. If the error of the encoded data word ENC(a(1)) and the associated error correction code $cv_A(1)$ is regarded as a more-than-two-bit error, the checker 84 may trigger some exceptional measure in step S15 to be performed. If, for example, the recipient at the output 98 is a CPU, the checker 84 may notify in step S15 the CPU about the exceptional situation, namely the more-than-two-bit error in the currently inspected encrypted data word whereupon the CPU may be configured to cease a currently executed program or stop processing at all or the like. If, for example, the CPU is a controller for a security chip card, the exceptional situation of step S15 may be interpreted as a fault attack onto the security controller, necessitating a cessation of further processing in order to defend the fault attack.

If, however, the error of the encoded data word ENC(a(1)) is regarded as a double-bit error, the checker 84 requests in step S16 the number w of further encrypted data words along with their associated error correction codes, here via the connection 90 from the memory 20, namely the encrypted data words and associated error correction codes corresponding to the other indices except one, namely 0, and 2 to w. Briefly interrupting the current description, such a double-bit error detection as mentioned in step S14 may also be used between steps S4 and S5 in FIG. 2 in order to perform step S5 merely in case the more-than-one-bit error turns out to be a double-bit error and ceases the further processing without a further trial of correction in case of a more-than-two-bit error.

Upon the checker 84 receiving the other encrypted data words and their associated error correction codes via the receiver 82 upon the request in step S16, the checker 84 checks all of the further encrypted data words and their associated error correction codes as to whether same are correct in step S17. This check corresponds to applying step S11 to all these further encrypted data words and their associated error correction codes. If all of them are correct, the checker 84 proceeds with requesting via the correction 94 a decryption of these further encrypted data words by the decryption device 92 with outputting the latter via the output 88 to the input of the decryption device 92 as shown in step S18. The decryption device 92 decrypts all these encrypted data words to obtain a(0), a(2) to a(w) and outputs the same via the data connection 96 to the checker 84 as the checker 84 requests such back transmission via the connection 94. The checker 84 then forms a mod-2 sum of the decrypted correct version of the further encrypted data words in step S19, thereby obtaining a decrypted correct version, i.e. a(1), of the encrypted data word ENC(a(1)) provided the error situation of all the encrypted data words and their associated error correction codes have correctly been determined in steps S17, S14 and S11, respectively.

As shown in FIG. 12, the process may stop here. However, the checker 84 may alternatively be configured to proceed to determine as to whether any of the just-mentioned assumptions regarding the error situations of the data as shown in FIG. 11 are false. Accordingly, the checker 84 may be configured to request the device 92 to encrypt the mod-2 sum of the decrypted further encrypted data words in step S20 by forwarding the mod-2 sum via the output 88 to the device 92 and instructing the device 92 via the connection 94 to send the encryption result back via the data path 96. The result of step S20 is a correct version of the encrypted data word ENC(a(1)) provided all assumptions are correct. Accordingly, the checker 84 is able to check in step S21 as to whether the encrypted data word ENC(a(1)) as obtained via the input 86, in fact merely deviates at two bit positions from the encrypted version of the mod-2 sum as obtained from the device 92 via the data connection 96. If this is the case, the checker 84 may allow for further processing in step S22, whereas the checker 84 may request exceptional measures to be taken in step S23 in case of the deviation exceeding the number of two bit positions. For example, the checker 84 may be configured to output an alarm signal resulting in disabling of cryptographic functions of the device, for example. The same may apply to step S15.

Of course, the check in step S17 may reveal that not only the encrypted data word of interest, i.e. ENC(a(1)) is incorrect, but also one of the other encrypted data words of set 128. In this case, the checker 84 may either take an exceptional measure in step S24 directly without any further trial to correct any of these further encrypted data words, alternatively, the checker 84 may be configured to perform an x-bit error correction in step S25 on all those encrypted data words, which turned out to be incorrect in test 817, which corresponds to step S11. According to the latter alternative, the process may proceed with step S24, in case the single-bit error correction in step S25 failed for any of these further encrypted data words (with indices 0, 2, 3, . . . w), and with step S18 in case all single-bit error corrections in step S25 were successful.

As indicated above, the system of FIG. 10 may also include a device 120 for protecting an encrypted data word, encrypted by the device 92 upon a request for storing plain text data words entering via the input 104 and having been encrypted by the device 92. Before explaining a possible configuration of the device 120, in accordance with an alternative embodiment, the system shown in FIG. 10 does not include the device 18, but merely the device 124, protecting the data, the system having, accordingly, merely the data generation capability, rather than the data retrieval capability described above. In the latter case, the unit 92 may merely be operative for encryption rather than decryption.

The determiner 122 may be configured to determine the error correction code $cv_A(1)$ associated with the encrypted data word ENC(a(1)) so that $cv_A(1)=ENC(a(1))A^T$ with, again, assuming that this encrypted data word is the data word of interest, i.e., the content of a(1) shall be stored into the memory 20 upon a request from some entity connected to the device 92 via the connection 104. The updater 124 is configured to update a predetermined one of the w further encrypted data words, namely ENC(a(w)), so as to correspond to a mod-2 sum of the predetermined encryption data word ENC (a(1)) as obtained via the connection 106, the previous version thereof as stored in the memory 20 and the previous version of the predetermined encrypted data word ENC(a(w)). Further, the updater 124 updates the error correction code $cv_A(w)$ associated with a predetermined encrypted data word so as to be equal to (result of the mod-2 sum)$A^T$. Thus, altogether, four data items in FIG. 11 change upon a request to overwrite any of the encrypted data words ENC(a(0)) to ENC(a(w−1)), merely the respective encoded data word itself is overwritten along with the error correction code thereof, which is adapted to the new content of the respective encrypted data word, and the encrypted data word ENC(a(w)) and its associated error correction code $cv_A(w)$, as has been outlined just before.

An enhancement of the embodiments described just before with respect to FIGS. 10-13 combines the latter embodiments with the first two matrices defining the base systematic error correction code of FIG. 4. The result is a special 2-bit error correction code. A first stage is formed by the single-bit error correcting and 2-bit error detecting code on word level offered by the systematic base correction code scheme involving the error correction code $cv_A$. The second stage uses the encryption/decryption capability on block or data word set level to correct 2-bit errors detected on word level in the first stage, if no further 1-bit or 2-bit errors are seen in the other words of the block. Again, similar to the embodiment of FIG. 3b, this results in the possibility of independent scaling of single-bit error correction capabilities and double-bit error correction capabilities.

In particular, the generator matrix A of FIG. 4 may be used to form the 1-bit error correcting and 2-bit error detecting code according to $cv_A=aA^T$ for all w+1 word shown in FIG. 11 with a block containing, as indicated above, w data word+1 EDC word. Accordingly, w+1 extended words are stored in the memory 20, namely $(a_i|cv_{Ai})$ with n+k bits each (or an encrypted version thereof, respectively). In FIG. 11, for example, all blocks with solid lines indicate the values written to the memory 20, respectively.

Figure 13:
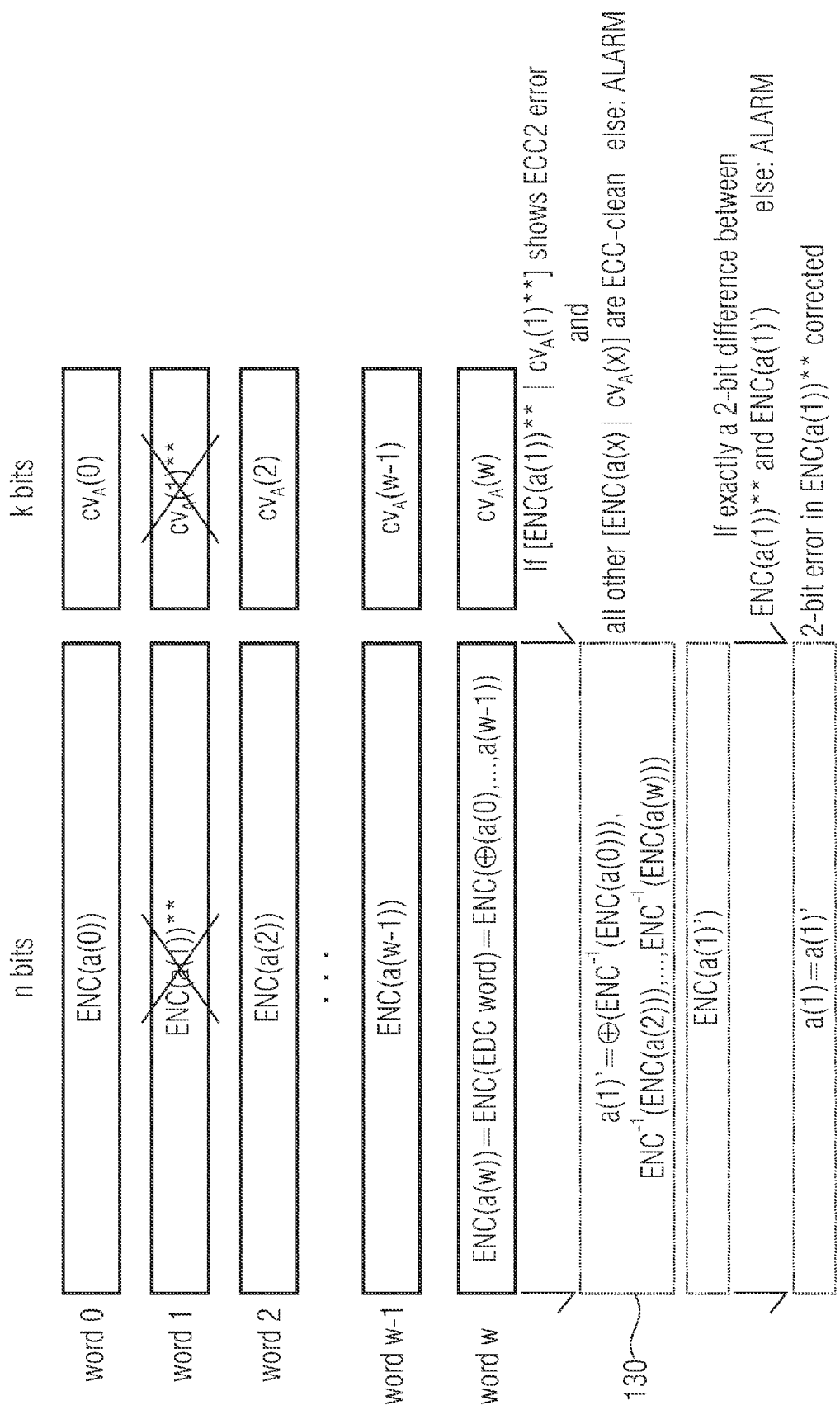
FIG. 13 shows a schematic diagram of the data shown in FIG. 11 along with intermediate data resulting therefrom when error correcting one of the data words therein.

In order to retrieve a certain extended word comprising the encrypted data word and its associated error correction code, the following process may be used with respect to FIG. 13 with, however, the correspondences to FIG. 12 being indicated in parentheses:
Read extended word $(ar^*|cv_{Ar})$ from memory 20 ("*" means potential distortion) (c.f. S10) (in FIG. 13 ar* is ENC(a(1))**);
Use code with control matrix H=(A|I) to detect/correct errors:
1. If syndrom vector $s=H\ (ar^*|cv_{Ar}^*)^T=0$, correct data is assumed and no further steps are necessary; read word ar=ar* is assumed to be correct (c.f. S12);
2. If syndrom vector $s=H\ (ar^*|cv_{Ar}^*)^T\neq 0$ indicates single-bit error, a single-bit error is assumed and corrected using sub-code and no further steps are necessary; read word ar is assumed to be correct after the correction (success alternative);
3. If syndrom vectors $s=H\ (ar^*|cv_{Ar}^*)^T\neq 0$ indicates double-bit error (c.f. S14), a double-bit error is assumed and the following procedure is executed:
 a. In a loop over all w remaining extended words of the block (j=0 ... w; j≠r)
  read $(aj^*|cv_{Aj}^*)$ (c.f. S16)
  If $sj=H\ (aj^*|cv_{Aj}^*)^T=0$, aj* is correct (c.f. S17);
  If $sj=H\ (aj^*|cv_{Aj}^*)^T\neq 0$, no correction of $(ar^*|cv_{Ar}^*)$ is performed, since too many errors in block→alarm (c.f. S24);
 b. Compute mod-2-sum of all $ENC^{-1}(aj)$ (j=0 ... w; j≠r) to get $ENC^{-1}(ar\_new^*)$ (c.f. S18, S19);
 c. Check if $(ENC(ENC^{-1}(ar\_new^*))|cv_{Ar\_new}^*)$ and $(ar^*|cv_{Ar}^*)$ differ in exactly 2 bit positions (c.f. S20, S21), then use ar=ar_new* (c.f. S22), else→alarm (c.f. S23).

In the above embodiments, although the other [ENC(a(x))|$cv_A(x)$] could contain ECC1 errors, the need to be ECC-clean is higher to keep maximum security of the scheme.

Accordingly, FIG. 13 shows a station of reading the memory 20 when [ENC(a(1))|$cv_A(x)$] contains a double-bit error: blocks with solid lines indicate values stored in the memory 20, blocks with dotted lines indicate intermediate computed values used to correct the double-bit error.

The memory overhead is as follows:
bits per w-word block for 1-bit error correcting code: (32+1)*w+33
bits per w-word block for 2-bit error correcting code: (32+7)*w+39
→overhead=(6w+6)/(33w+33)
w=8: overhead=18.2%.

Although some aspects have been described in the context of an apparatus, these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments include a data carrier having electronically readable control signals, which are capable of cooperating with a programmable computer system, such that one of the methods described herein is performed.

Generally, embodiments can be implemented as a computer program product with a program code, the program code being operative for performing one of the methods when the computer program product runs on a computer. The program code may for example be stored on a machine readable carrier.

Other embodiments include the computer program for performing one of the methods described herein, stored on a machine readable carrier.

In other words, an embodiment of the inventive method is, therefore, a computer program having a program code for performing one of the methods described herein, when the computer program runs on a computer.

A further embodiment is, therefore, a data carrier (or a digital storage medium, or a computer-readable medium) having, recorded thereon, the computer program for performing one of the methods described herein. The data carrier, the digital storage medium or the recorded medium are typically tangible and/or non-transitionary.

A further embodiment is, therefore, a data stream or a sequence of signals representing the computer program for performing one of the methods described herein. The data stream or the sequence of signals may for example be configured to be transferred via a data communication connection, for example via the Internet.

A further embodiment includes a processing means, for example a computer, or a programmable logic device, configured to or adapted to perform one of the methods described herein.

A further embodiment includes a computer having installed thereon the computer program for performing one of the methods described herein.

A further embodiment includes an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array r T may cooperate with a microprocessor in order to perform one of the methods described herein. Generally, the methods are preferably performed by any hardware apparatus.

Terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A device for error correction comprising:
a receiver configured to receive a data word a and an error correction code $cv_A$ associated with the data word a; and
a checker configured to:
declare the data word a as being correct if $cv_A$ equals $aA^T$, with A being a generator matrix of a linear systematic base correction code;
perform, if $cv_A$ is unequal to $aA^T$, an x-bit error correction on the data word a and the associated error correction code $cv_A$ using columns of A in order to obtain a corrected version of the data word a and the associated error correction code $cv_A$ in the case of the x-bit error correction being successful, and assume a number of corrupted bits of the data word a and the associated error correction code $cv_A$ to be greater than x and perform, if the x-bit error correction fails;
obtaining an extension error correction code $cv_E$; and
performing a y-bit error correction with y>x, on the data word a and the error correction code $cv_A$ using the extension error correction code $cv_E$ and columns of an extended matrix $$F = \begin{pmatrix} A \\ E \end{pmatrix}$$

of an extended linear systematic correction code according to which $(cv_A|cv_E)=aF^T$ if the data word a, the error correction code $cv_A$ and the extension error correction code $cv_E$ were correct.

2. The device according to claim 1, wherein the receiver is configured to receive the data word a from a memory.

3. The device according to claim 1, wherein the checker is configured to, in obtaining the extension error correction code $cv_E$,
request a number w−1 of further data words a, forming, along with the data word a, a set of w data words, and further error correction codes $cv_{A_i}$ associated with the further data words $a_i$, respectively,
request an extension error correction code check sum msc,
check all of the further data words $a_i$ and the further error correction codes $cv_{A_i}$ as to whether the same are correct or correctable by the x-bit error correction, and
if all of the further data words $a_i$ and the associated further error correction codes $cv_{A_i}$ are correct or correctable,
derive extension error correction codes $cv_{E_i}$ for a correct version of the further data words $a_i$ so as to satisfy $(cv_{A_i}|cv_{E_i})=a_iF^T$,
use a mod-2 sum of the extension error correction codes $cv_{E_i}$ and the extension error correction code check sum msc as the extension error correction code $cv_E$, and,
if any of the further data words $a_i$ and associated further error correction codes $cv_{A_i}$ are not correctable by the x-bit error correction,
declare the data word a and the associated error correction code $cv_A$ as not being correctable using the y-bit error correction.

4. The device according to claim 3, wherein the checker is configured to, in requesting the number w−1 of further data words $a_i$, the associated error correction codes $cv_{A_i}$ and the extension error correction code check sum msc, send read commands to a memory to read the further data words $a_i$, the further error correction codes $cv_{A_i}$ and the extension error correction code check sum msc from the memory, wherein the receiver is configured to receive the data word a and the error correction code $cv_A$ from the memory.

5. The device according to claim 3, wherein the checker is configured to support sets of data words with different w's.

6. The device according to claim 1, wherein the checker is configured such that the linear systematic base correction code is a single-bit error correction and double-bit error detection code and x=1, and y=2.

7. The device according to claim 1, wherein the checker is configured such that the extension error correction code $cv_E$ has a length of l bits, a check matrix $$R = \begin{pmatrix} A & I & 0 \\ E & 0 & I \end{pmatrix}$$

of the extended linear systematic correction code has along its right-hand side outmost l columns at least one column which, added with another column of R, yields a sum of a different pair of columns of R.

8. The device according to claim 1, wherein the checker is configured such that E extends the columns of H=(A|I) such that the columns of $$\begin{pmatrix} A & I \\ E & O \end{pmatrix}$$

are pair-wise different, and no sum of any pair of columns of $$\begin{pmatrix} A & I \\ E & O \end{pmatrix}$$

equals another sum of another pair of columns of $$\begin{pmatrix} A & I \\ E & O \end{pmatrix}.$$

9. The device according to claim 1, wherein the data word or the encrypted data word a is of a length of n bits and the error correction code $cv_A$ is of a length of k bits, wherein $k=\lceil \log_2(n+1) \rceil$ and the checker is configured such that A is a matrix with k rows and n columns.

10. A device for protecting a data word against data corruption, comprising:
a first determiner configured to determine an error correction code $cv_A$ associated with a data word a so that $cv_A = aA^T$, with A being a generator matrix of a linear systematic base correction code, the columns of which enable performance of an x-bit error correction on replica of the data word a and the associated error correction code $cv_A$; and
a second determiner configured to determine an extended error correction code $cv_E$ so that $(cv_A|cv_E)=aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y>x, on a replica of the data word a and the associated error correction code $cv_A$.

11. The device according to claim 10, wherein the first and second determiners are configured to perform the respective determination in response to a write command according to which the data word a is to be written to a memory, and wherein the device is configured to write the error correction code $cv_A$ to the memory.

12. The device according to claim 10, further comprising a check sum updater configured to update an extension error correction code check sum msc so as to correspond to a mod-2 sum of a previous version of the extension error correction code check sum, to be updated, the extension error correction code $cv_E$ and a previous version of the extension error correction code $cv_E$ associated with the data word a.

13. The device according to claim 12, wherein the first and second determiners are configured to perform the respective determination in response to a write command according to which the data word a is to be written to a memory, wherein the device is configured to write the error correction code $cv_A$ along with the updated extension error correction code checksum msc to the memory.

14. A device for error correction comprising:
a receiver configured to receive an encrypted data word a and an error correction code $cv_A$ associated with the encrypted data word a; and
a checker configured to:
declare the encrypted data word a as being correct if $cv_A=aA^T$, with A being a generator matrix of a linear systematic base correction code;
perform, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code $cv_A$ so as to regard an error of the encrypted data word a to be a double-bit error or a more-than-two-bit error; and
if the error of the encoded data word a is regarded as a double-bit error,
request a number w of further encrypted data words forming, along with the encrypted data word a, a set of w+1 encrypted data words, along with further error correction codes associated with the further encrypted data words, respectively;
check all of the further encrypted data words and the further error correction codes as to whether the same are correct;
request a decryption of a correct version of the further encrypted data words in order to obtain a decrypted correct version of the further encrypted data words; and
form a mod-2 sum of the decrypted correct version of the further encrypted data words to obtain a decrypted correct version of the encrypted data word.

15. The device according to claim 14, wherein the checker is configured to, if the error of the encoded data word a is regarded as a double-bit error,
request an encryption of the decrypted correct version of the encrypted data word to obtain a correct version of the encrypted data word, and
compare the encrypted data word and the correct version of the encrypted data word to prove that the error of the encrypted data word a is a double-bit error.

16. The device according to claim 14, wherein the checker is configured to, if the error of the encrypted data word a is regarded as a more-than-two-bit error, output an alarm signal resulting in disabling of cryptographic functions of the device.

17. The device according to claim 15, wherein the checker is configured to, if the comparison of the encrypted data word and the correct version of the encrypted data word reveals that the error of the encrypted data word a is not a double-bit error, output an alarm signal resulting in disabling of cryptographic functions of the device.

18. The device according to claim 15, wherein the checker is configured to support sets of data words with different w's.

19. A device for protecting an encrypted data word, comprising:
a determiner configured to determine an error correction code $cv_A$ associated with an encrypted data word a so that $cv_A=aA^T$, with A being a generator matrix of a linear systematic base correction code, the columns of which enable performance of a single-bit error correction and a double-bit error detection on replica of the encrypted data word a and the associated error correction code $cv_A$; and an updater configured to update a predetermined one of w further encrypted data words forming, along with the encrypted data word a, a set of w+1 encrypted data words, so as to correspond to a mod-2 sum of the predetermined encrypted data word, the encrypted data word a and a previous version of the encrypted data word a, and update the error correction code associated with the predetermined encrypted data word so as to be equal to the predetermined encrypted data word times $A^T$.

20. A method of error correction comprising:

receiving, performed by a receiver, a data word a and an error correction code $cv_A$ associated with the data word a;

declaring, performed by a checker, the data word a as being correct if $cv_A$ equals $aA^T$, with A being a generator matrix of a linear systematic base correction code;

performing, performed by the checker, if $cv_A$ is unequal to $aA^T$, an x-bit error correction on the data word a and the associated error correction code $cv_A$ using columns of A in order to obtain a corrected version of the data word a and the associated error correction code $cv_A$ in the case of the x-bit error correction being successful, and assuming a number of corrupted bits of the data word a and the associated error correction code $cv_A$ to be greater than x and perform, if the x-bit error correction fails, obtaining an extension error correction code $cv_E$; and performing an y-bit error correction with y>x, on the data word a and the error correction code $cv_A$ using the extension error correction code $cv_E$ and columns of an extended matrix $$F = \begin{pmatrix} A \\ E \end{pmatrix}$$

of an extended linear systematic correction code according to which $(cv_A|cv_E)=aF^T$ if the data word a, the error correction code $cv_A$ and the extension error correction code $cv_E$ were correct, wherein at least one of the receiver and the checker is implemented in hardware.

21. A method of protecting a data word against data corruption, comprising:

determining, performed by a first determiner, an error correction code $cv_A$ associated with a data word a so that $cv_A=aA^T$, with A being a generator matrix of a linear systematic base correction code, the columns of which enable performance of an x-bit error correction on replica of the data word a and the associated error correction code $cv_A$; and determining, performed by a second determiner, an extended error correction code $cv_E$ so that $(cv_A|cv_E)=aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y=x, on a replica of the data word a and the associated error correction code $cv_A$, wherein at least one of the first and second determiners is implemented in hardware.

22. A method of error correction comprising:

receiving, performed by a receiver, an encrypted data word a and an error correction code $cv_A$ associated with the encrypted data word a;

declaring, performed by a checker, the encrypted data word a as being correct if $cv_A=aA^T$, with A being a generator matrix of a linear systematic base correction code;

performing, performed by the checker, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code $cv_A$ so as to regard an error of the encrypted data word a to be a double-bit error or a more-than-two-bit error; and if the error of the encrypted data word a is regarded as a double-bit error:

requesting, performed by the checker, a number w of further encrypted data words forming, along with the encrypted data word a, a set of w+1 encrypted data words, along with further error correction codes associated with the further encrypted data words, respectively;

checking, performed by the checker, all of the further encrypted data words and the further error correction codes as to whether the same are correct;

requesting, performed by the checker, a decryption of a correct version of the further encrypted data words in order to obtain a decrypted correct version of the further encrypted data words;

requesting, performed by the checker, an encryption of a mod-2 sum of the decrypted correct version of the further encrypted data words to obtain a correct version of the encrypted data word; and comparing, performed by the checker, the encrypted data word and the correct version of the encrypted data word to prove that the error of the encrypted data word a is a double-bit error, wherein at least one of the receiver and the checker is implemented in hardware.

23. A method of protecting an encrypted data word, comprising:

determining, performed by a determiner, an error correction code $cv_A$ associated with an encrypted data word a so that $cv_A=aA^T$, with A being a generator matrix of a linear systematic base correction code, the columns of which enable performance of a single-bit error correction and a double-bit error detection on replica of the encrypted data word a and the associated error correction code $cv_A$; and updating, performed by an updater, a predetermined one of w further encrypted data words forming, along with the encrypted data word a, a set of w+1 encrypted data words, so as to correspond to a mod-2 sum of the predetermined encrypted data word, the encrypted data word a and a previous version of the encrypted data word a, and update the error correction code associated with the predetermined encrypted data word so as to be equal to the predetermined encrypted data word times $A^T$, wherein at least one of the determiner and the updater is implemented in hardware.

24. A non-transitory computer readable medium storing a computer program configured to perform error correction, the computer program comprising:
program instruction to determine an error correction code $cv_A$ associated with a data word a so that $cv_A = aA^T$, with A being a generator matrix of a linear systematic base correction code, the columns of which enable performance of an x-bit error correction on replica of the data word a and the associated error correction code $cv_A$; and
program instructions to determine an extended error correction code $cv_E$ so that $(cv_A | cv_E) = aF^T$, with F being an extended generator matrix $$F = \begin{pmatrix} A \\ E \end{pmatrix}$$

of an extended linear systematic correction code, the columns of which enable, using the extension error correction code $cv_E$, performance of an y-bit error correction, with y=x, on a replica of the data word a and the associated error correction code $cv_A$.

25. A non-transitory computer readable medium storing a computer program configured to perform error correction, the computer program comprising:
program instructions to receive an encrypted data word a and an error correction code $cv_A$ associated with the encrypted data word a;
program instructions to declare the encrypted data word a as being correct if $cv_A = aA^T$, with A being a generator matrix of a linear systematic base correction code;
program instructions to perform, if $cv_A$ is unequal to $aA^T$, using columns of A, a single-bit error correction on the encrypted data word a and the associated error correction code $cv_A$ in order to obtain a corrected version of the encrypted data word a and the associated error correction code $cv_A$ in case of the single-bit error correction being successful, and, in case of the single-bit error correction failing, a double-bit error detection on the encrypted data word a and the associated error correction code $cv_A$ so as to regard an error of the encrypted data word a to be a double-bit error or a more-than-two-bit error; and
program instructions to, if the error of the encrypted data word a is regarded as a double-bit error:
request a number w of further encrypted data words forming, along with the encrypted data word a, a set of w+1 encrypted data words, along with further error correction codes associated with the further encrypted data words, respectively;
check all of the further encrypted data words and the further error correction codes as to whether the same are correct;
request a decryption of a correct version of the further encrypted data words in order to obtain a decrypted correct version of the further encrypted data words;
request an encryption of a mod-2 sum of the decrypted correct version of the further encrypted data words to obtain a correct version of the encrypted data word; and
compare the encrypted data word and the correct version of the encrypted data word to prove that the error of the encrypted data word a is a double-bit error.

* * * * *